(12) United States Patent
Park et al.

(10) Patent No.: US 6,804,150 B2
(45) Date of Patent: Oct. 12, 2004

(54) NON-VOLATILE SEMICONDUCTOR MEMORY DEVICE WITH IMPROVED PROGRAM INHIBITION CHARACTERISTICS AND METHOD OF PROGRAMMING THE SAME

(75) Inventors: Jung-Hoon Park, Kyunggi-do (KR); Young-Ho Lim, Kyunggi-do (KR); Hyoung-Gon Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 75 days.

(21) Appl. No.: 10/236,585

(22) Filed: Sep. 6, 2002

(65) Prior Publication Data

US 2003/0048662 A1 Mar. 13, 2003

(30) Foreign Application Priority Data

Sep. 7, 2001 (KR) ........................................ 2001-55012

(51) Int. Cl.[7] ............................................. G11C 16/04
(52) U.S. Cl. ............................ 365/185.18; 365/185.17; 365/185.23; 365/185.02; 365/185.19; 365/196
(58) Field of Search ...................... 365/185.18, 185.17, 365/185.23, 185.02, 185.19, 196

(56) References Cited

U.S. PATENT DOCUMENTS

| | | |
|---|---|---|
| 5,408,133 A | 4/1995 | Honnigford et al. |
| 5,677,873 A | 10/1997 | Choi et al. |
| 5,715,194 A | 2/1998 | Hu |
| 5,991,202 A | 11/1999 | Derhacobian |
| 6,061,270 A | 5/2000 | Choi |
| 6,469,933 B2 * | 10/2002 | Choi et al. ............. 365/185.17 |
| 6,597,609 B2 * | 7/2003 | Chevallier .................. 365/201 |

FOREIGN PATENT DOCUMENTS

JP    10-083686    3/1998

OTHER PUBLICATIONS

English language of Abstract for Japanese Patent Publication No. 10–083686.

* cited by examiner

*Primary Examiner*—Connie C. Yoha
(74) *Attorney, Agent, or Firm*—Margar Johnson & McCollom, P.C.

(57) ABSTRACT

A non-volatile integrated circuit NAND type flash memory device is provided that includes a select line driver and a slope control circuit. The select line driver supplies a string select line with a select voltage limited below a power supply voltage while a program voltage is supplied to a word line. The slope control circuit controls a rising slope of the program voltage such that a capacitive coupling does not arise between the string select line and a selected word line during a program operation. At this time, the select voltage that the select line driver supplies into the string select line is lower than the power supply voltage, and a difference between the select voltage and the power supply voltage is at least as much as a coupling voltage between the string select line and the selected word line. In addition, the program voltage that the slope control circuit supplies into the selected word line can be increased in a staircase form during the program operation.

32 Claims, 15 Drawing Sheets

NON-VOLATILE SEMICONDUCTOR MEMORY DEVICE WITH IMPROVED PROGRAM INHIBITION CHARACTERISTICS AND METHOD OF PROGRAMMING THE SAME

RELATED APPLICATION

This application claims priority from Korean Patent Application No. 2001-55012, filed on Sep. 7, 2001, the contents of which are herein incorporated by reference in their entirety.

TECHNICAL FIELD

Embodiments of the present invention relate to a non-volatile semiconductor memory device, and, more specifically, relate to a NAND type of a flash EEPROM device with good program inhibition characteristics. In addition, embodiments of the invention are directed to a method of programming a NAND type flash EEPROM device.

BACKGROUND

FIG. 1 is a block diagram of a conventional NAND type flash EEPROM device. Referring to FIG. 1, the flash memory device includes a memory cell array 10, a high voltage pump circuit 20, a row pre-decoder 30, a row decoder 40, and a page buffer and column decoder block 50.

The memory cell array 10 is formed of a plurality of memory cell blocks. Each of the memory cell blocks includes a plurality of memory cell strings (so-called "NAND strings"). Each cell string includes several floating gate transistors TC1 to TC16 or TC17 to TC32, as memory cells. Channels of the respective floating gate transistors TC1 to TC16 or TC17 to TC32 are connected in series between a channel of a string select transistor TS1 or TS2 and a channel of a ground select transistor TG1 or TG2.

Each block of the memory cell array 10 further includes a string select line SSL, a ground select line GSL, word lines WL1 to WL16, and bit lines BL1 to BLn. The string select line SSL is connected in common with gates of string select transistors TS1, . . . , TS2. Each word line WL1, WL2, . . . , or WL16 is connected in common to control electrodes of corresponding floating gate transistors (e.g., TC1, . . . , TC17). A word line and a plurality of corresponding floating gate transistors connected thereto are normally called a "page". Conventionally, an appropriate number of pages (e.g., 8 or 16 pages) constitute a single cell block in the memory cell array 10. The ground select line GSL is connected in common to gates of a plurality of ground select transistors TG1, . . . , TG2. Each of the bit lines BL1, . . . and BLn is connected to a corresponding cell string.

The high voltage pump circuit 20 generates a high voltage VPP needed in a write operation (generally, erasing plus programming) of memory cells. The row pre-decoder 30 receives the high voltage VPP from the high voltage pump circuit 20, and drives a global string select line and a global ground select line in response to a string select line enable signal and a ground select line enable signal, respectively. In addition, the row pre-decoder 30 drives global word lines corresponding to a single memory cell block selected by address signals. Voltages on the global string select line, the global word lines and the global ground select line are transferred onto corresponding lines of the selected memory cell block (i.e., the string select line SSL, word lines WL1 to WL16, and the ground select line GSL), in control of the row decoder 40, respectively. The page buffer and column decoder block 50 either senses and provides voltages on the bit lines to outside the memory device, or transfers voltages from outside the memory device onto the bit lines.

The above-described conventional flash memory device may employ a program inhibition technique using either a self-boosting or a local self-boosting in order to inhibit unwanted memory cells from being programmed during a program operation. Examples of program inhibition technique using a self-boosting are found in U.S. Pat. No. 5,677,873 and U.S. Pat. No. 5,991,202. The program inhibition technique using a local self-boosting is disclosed in, for example, U.S. Pat. No. 5,715,194 and U.S. Pat. No. 6,061,270.

Notwithstanding adoption of such program inhibition techniques, a capacitive coupling between adjacent signal lines increases with a decrease in a space interval between adjacent signal lines, due to a present trend toward a high integration. This coupling may cause a program inhibition failure or a program failure.

FIG. 2 is a timing diagram of a program operation of the flash memory device of FIG. 1. Referring now to FIGS. 1 and 2, a program operation of the flash memory device will be described in detail.

As is known to those skilled in the art, first, cell transistors TC1 to TC32 are commonly erased to have negative threshold voltages prior to a beginning of a program operation of the NAND type flash memory device.

During a program operation, the power supply voltage VCC and the ground voltage VSS (or 0V) are applied to a string select line SSL and a ground select line GSL, respectively. In addition, the power supply voltage VCC and the ground voltage VSS are respectively applied to a bit line BL1 corresponding to a program inhibited string (TS1, TC1 to TC16, TG1) and a bit line BLn corresponding to a programmed string (TS2, TC17 to TC32, TG2). Accordingly, channel voltages of respective cell transistors TC1 to TC16 are increased up to VCC−Vth, where Vth is a threshold voltage of the string select transistor TS1.

Once the channel voltages of the respective cell transistors TC1 to TC16 go up to VCC−Vth, string select transistor TS1 is substantially shut off since a source-gate voltage of the transistor TS1 does not exceed its threshold voltage Vth. This results in an electrical insulation between the cell transistors TC1 to TC16 and the bit line BL1. In addition, with the application of the ground voltage VSS to the ground select line GSL, the ground select transistor TG1 is in a turn-off state, and thus channels of the cell transistors TC1 to TC16 are in a floating state.

In such a state, when a pass voltage Vpass is applied to the word lines WL2 to WL16 connected to the memory cell transistors TC2 to TC16 and TC18 to TC32 that are not intended to be programmed, a capacitive coupling between the word lines WL2 to WL16 and the cell transistors TC1 to TC16 may cause channel voltages of the respective cell transistors TC1 to TC16 held in a floating state to be boosted. This reduces a voltage difference between floating gates and channels of the program inhibited cell transistors TC1 to TC16, thereby preventing the occurrence of an F-N tunneling therebetween. As a result, the program inhibited cell transistors TC1 to TC16 may be maintained in an erased state.

Thereafter, to program the memory cell transistor TC17, a program voltage Vpgm may be applied to the word line WL1 connected to the cell transistor TC17. In such a case, a rise time of the program voltage Vpgm may be about 1 to 2 microseconds.

As mentioned before, however, a capacitive coupling between adjacent signal lines increases with a decrease in the space interval between the signal lines, due to parasitic capacitors 12, C1 to C16 located between the signal lines as shown in FIG. 1.

Accordingly, in such a highly integrated memory device of FIG. 1, when a program voltage Vpgm is supplied to a word line (e.g., WL1) adjacent to the string select line SSL in order to program a cell transistor (e.g., TC17) coupled to the word line, a voltage on the string select line SSL may increase by a coupling voltage Vcpl from the power supply voltage VCC, as shown in FIG. 2, because of a capacitive coupling between the word line and the string select line or because of a parasitic capacitor C1, which results from an abrupt rise of the program voltage Vpgm, so that the string select transistor TS1 will turn on. As a result, electric charges induced on channels of the program inhibited cell transistors (e.g., TC1 to TC16) will move to a corresponding bit line (e.g., BL1), so channel voltages of the program inhibited cell transistors will become lower and the voltage difference between the word lines WL1 to WL16 and the channels of the cell transistors TC1 to TC16 will increase. This will consequently result in a program inhibition failure or program disturb of the cell transistors TC1 to TC16.

Based upon the above and foregoing, it can be appreciated that there presently exists a need in the art for a NAND type of a nonvolatile flash memory device which eliminates the above-described drawbacks and shortcomings of the presently available NAND type flash memory devices.

SUMMARY OF THE INVENTION

Embodiments of the invention provide a NAND type of a non-volatile flash memory device with improved program inhibition characteristics and a method of efficiently programming the same.

According to an aspect of the present invention, a non-volatile integrated circuit memory device includes a first select line, a first select transistor, a word line adjacent to and disposed in parallel with the first select line, a non-volatile memory cell transistor, a second select line, a second select transistor, and a high voltage pump circuit.

DETAILED DESCRIPTION

Embodiments of the present invention will now be more fully described hereinafter with reference to the accompanying drawings, in which preferred embodiments of the invention are shown.

Figure 1:
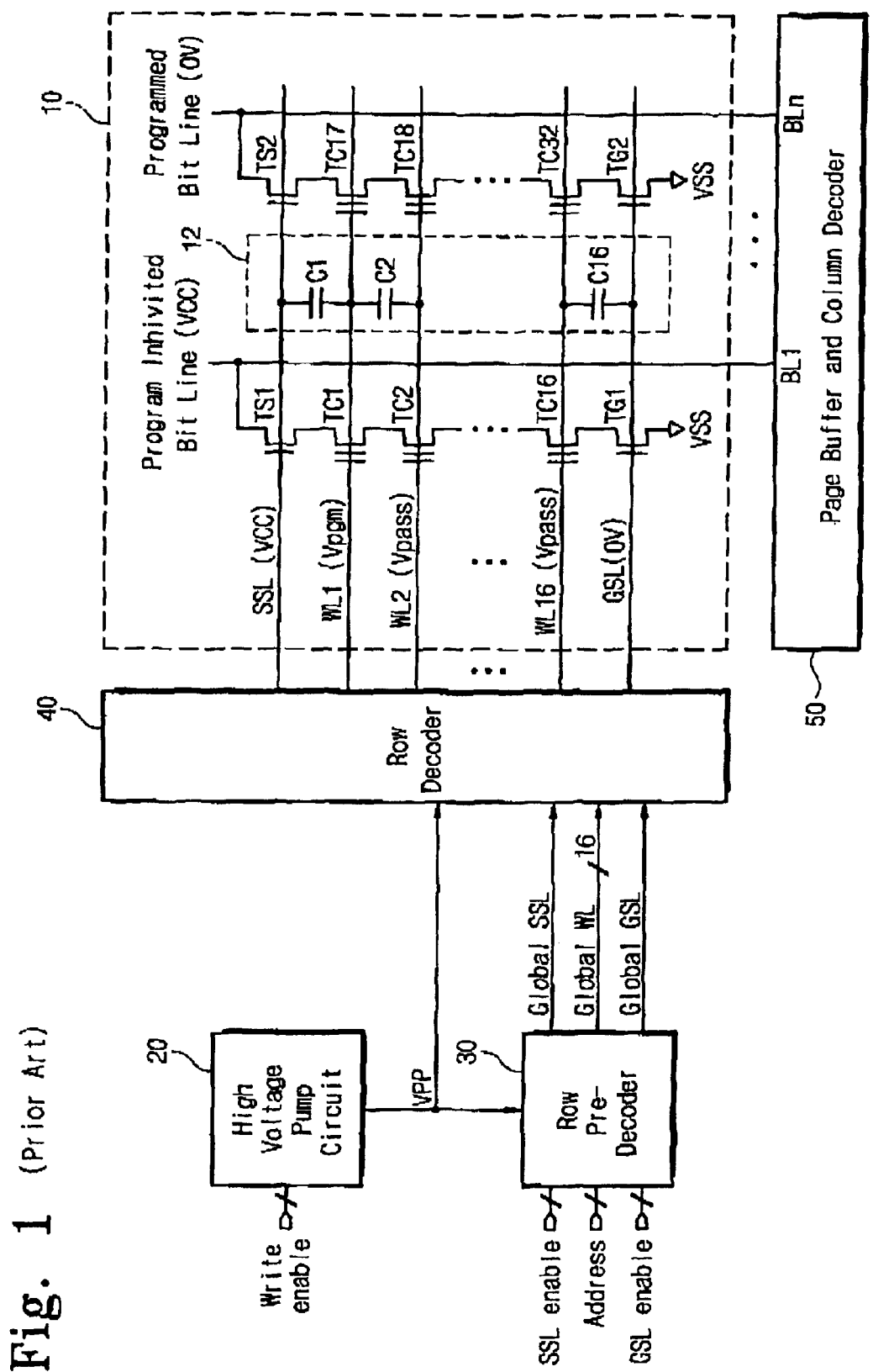
FIG. 1 is a block diagram of a conventional non-volatile semiconductor memory device.
Figure 2:
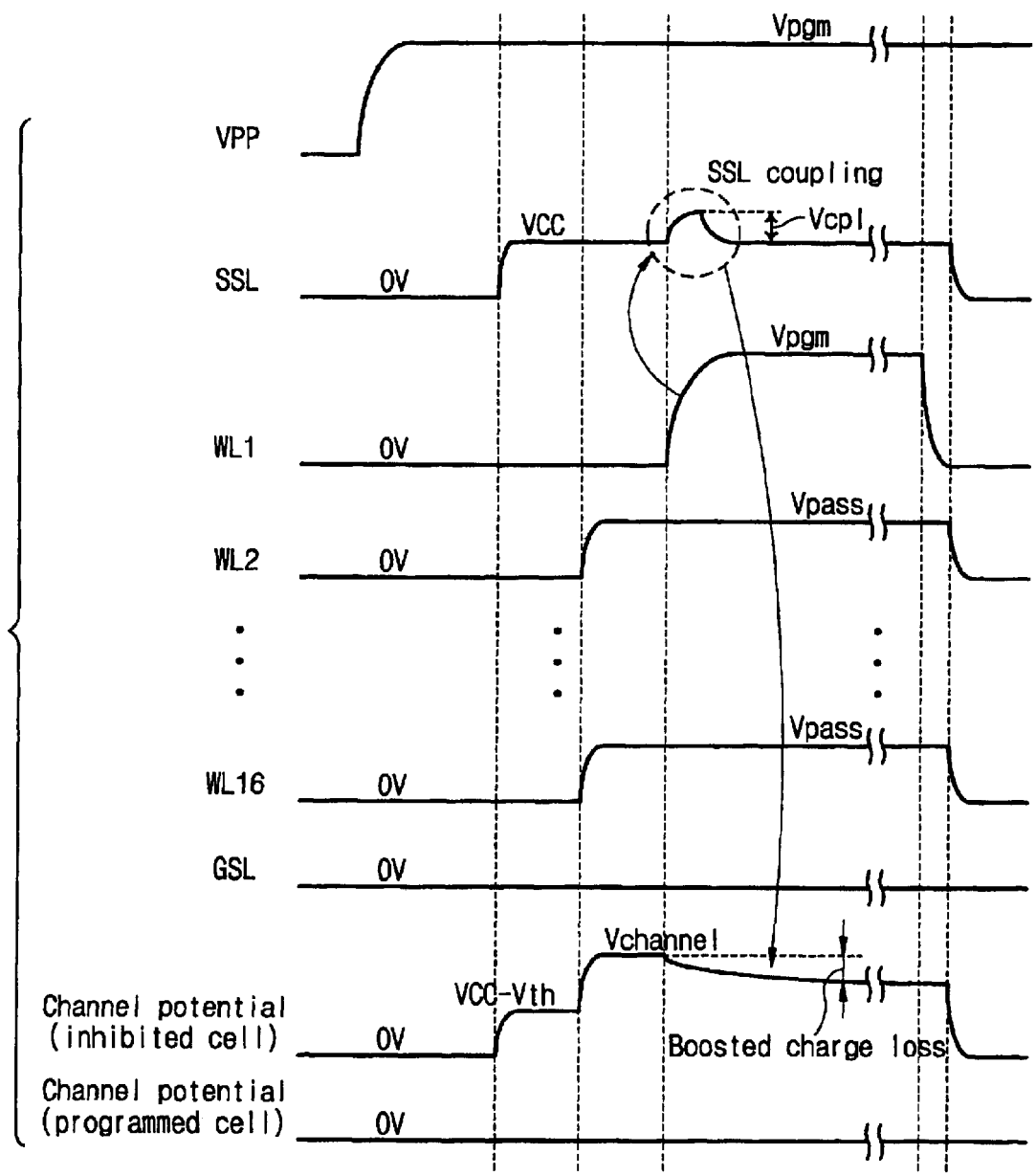
FIG. 2 is a timing diagram of a program operation of the memory device of FIG. 1.
Figure 3:
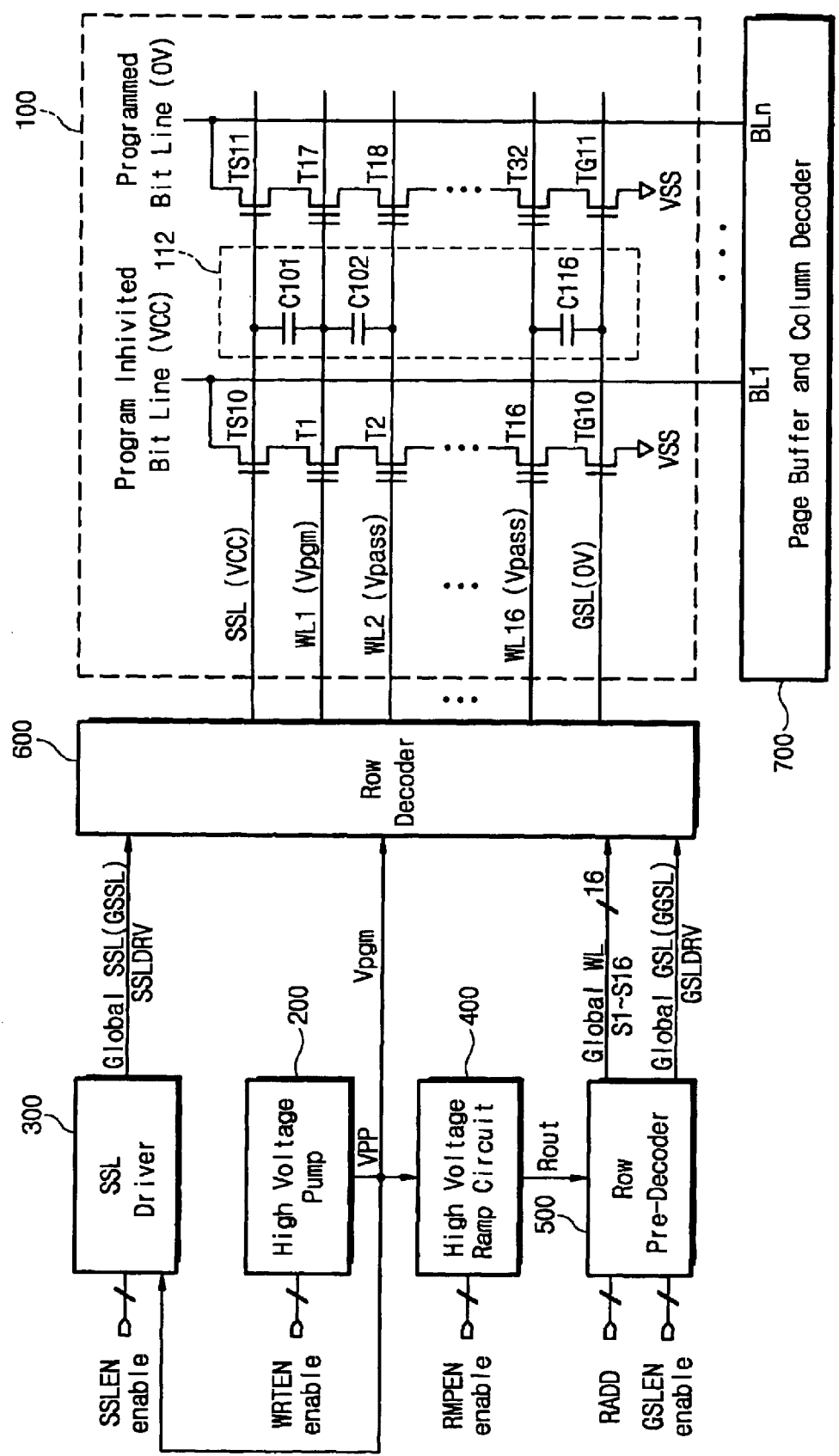
FIG. 3 is a block diagram of an embodiment of a non-volatile semiconductor memory device according to the present invention.

FIG. 3 is a block diagram of an embodiment of a highly integrated NAND type flash memory device according to embodiments of the present invention.

Referring to FIG. 3, the flash memory device includes a memory cell array 100. This memory cell array 100 is preferably constructed with a plurality of memory cell blocks, although not shown in FIG. 3.

Each of the memory cell blocks includes a string select line SSL, a ground select line GSL, word lines WL1 to WL16, and bit lines BL1 to BLn. In addition, each of the memory cell blocks includes several memory cell strings ("NAND strings"). Each of the cell strings includes a number of floating gate transistors (e.g., T1 to T16 or T17 to T32) that serve as memory cells. Channels of the floating gate transistors of the respective cell strings are connected in series between a channel of a string select transistor (e.g., TS10 or TS11) and a channel of a ground select transistor (e.g., TG10 or TG11).

The string select line SSL is connected in common to gates of a plurality of string select transistors TS10, . . . , TS11. Each word line WL1, WL2, . . . , or WL16 is connected in common to control gates of the corresponding floating gate transistors (e.g., T1, . . . , T17). The ground select line GSL is connected in common to gates of the ground select transistors TG10, . . . , TG11. Each of the bit lines BL1, . . . , and BLn is connected to a corresponding cell string. In FIG. 3, a portion denoted by a reference numeral 112 illustrates parasitic capacitors C101 to C116.

The flash memory device of FIG. 3 further includes a high voltage pump circuit 200, a string select line driver 300, a high voltage ramp circuit 400, a row pre-decoder 500, a row decoder 600, and a page buffer and column decoder block 700.

The high voltage pump circuit 200 generates a high voltage VPP (or a program voltage Vpgm) in response to a write enable signal WRTEN. The high voltage VPP generated from the high voltage pump circuit 200 is supplied to the string select line driver 300, the high voltage ramp circuit 400, and the row decoder 600.

The string select line driver 300 generates a global string select line driving signal SSLDRV, which is used to supply a select voltage Vsel (limited below a power supply voltage VCC), in response to a string select line enable signals SSLEN while the program voltage Vpgm is supplied to the word line WL. At this time, the global string select line driving signal SSLDRV is supplied to the row decoder 600 via a global string select line GSSL.

The high voltage ramp circuit 400 serves as a slope control circuit that controls a rising slope of the program voltage Vpgm in response to ramper enable signals RMPEN such that no capacitive coupling between the select line SSL and the word line WL (especially, WL1) during a program operation. An output signal Rout of the ramp circuit 400 is supplied into the row pre-decoder 500.

The row pre-decoder 500 drives global word lines S1 to S16 corresponding to the word lines WL1 to WL16 respectively in response to a row address RADD supplied from outside the memory device. At this time, the row pre-decoder 500 transfers the output voltage Rout of the high voltage ramp circuit 400 into the selected global word line(s). In addition, the row pre-decoder 500 generates a global ground select line driving signal GSLDRV for driving a global ground select line GGSL in response to a ground select line enable signal GSLEN.

The row decoder 600 is coupled with the global string select line GSSL, the global word lines S1 to S116, and the global ground select line GGSL, and allows voltages on the global string select line GSSL, the global word lines S1 to S16, and the global ground select line GGSL to be transferred to such respective corresponding lines on the cell array as the string select line SSL, the word lines WL1 to WL16, and the ground select line GSL.

The page buffer and the column decoder block 700 selects one from the bit lines BL1 to BLn in response to a column address, and reads data from the selected bit line or writes data to the selected bit line.

Meanwhile, it is understood to those skilled in the art that the above-mentioned enable signals WRTEN, SSLEN, RMPEN, and GSLEN are supplied by a control block (not shown) of the flash memory device.

An example unit program operation of the flash memory device of the invention includes the following seven sub-operations: a "high voltage setup" for generating a high voltage; a "bit line setup" for supplying the bit lines with necessary voltages; a "word line boost" for boosting word lines; a "cell program" for programming the selected cells; a "recovery" for stopping generating the high voltage and getting the bit line and the word lines back into their preset states; a "verify" for reading data from the programmed cells; and a "scan" for discriminating between a success and a failure of programming, depending on the data read from the programmed cells. A time to perform this unit program operation of the flash memory (hereinafter referred to as a "program time") is approximately 40–50 microseconds.

The flash memory device is also programmed by the page of a plurality of memory cells (typically on a row). Programming a page of the memory device is completed by repeatedly performing such a unit program operation seven to eight times, for example. Accordingly, a "page program time" of the flash memory device is about 200–500 microseconds.

Figure 4:
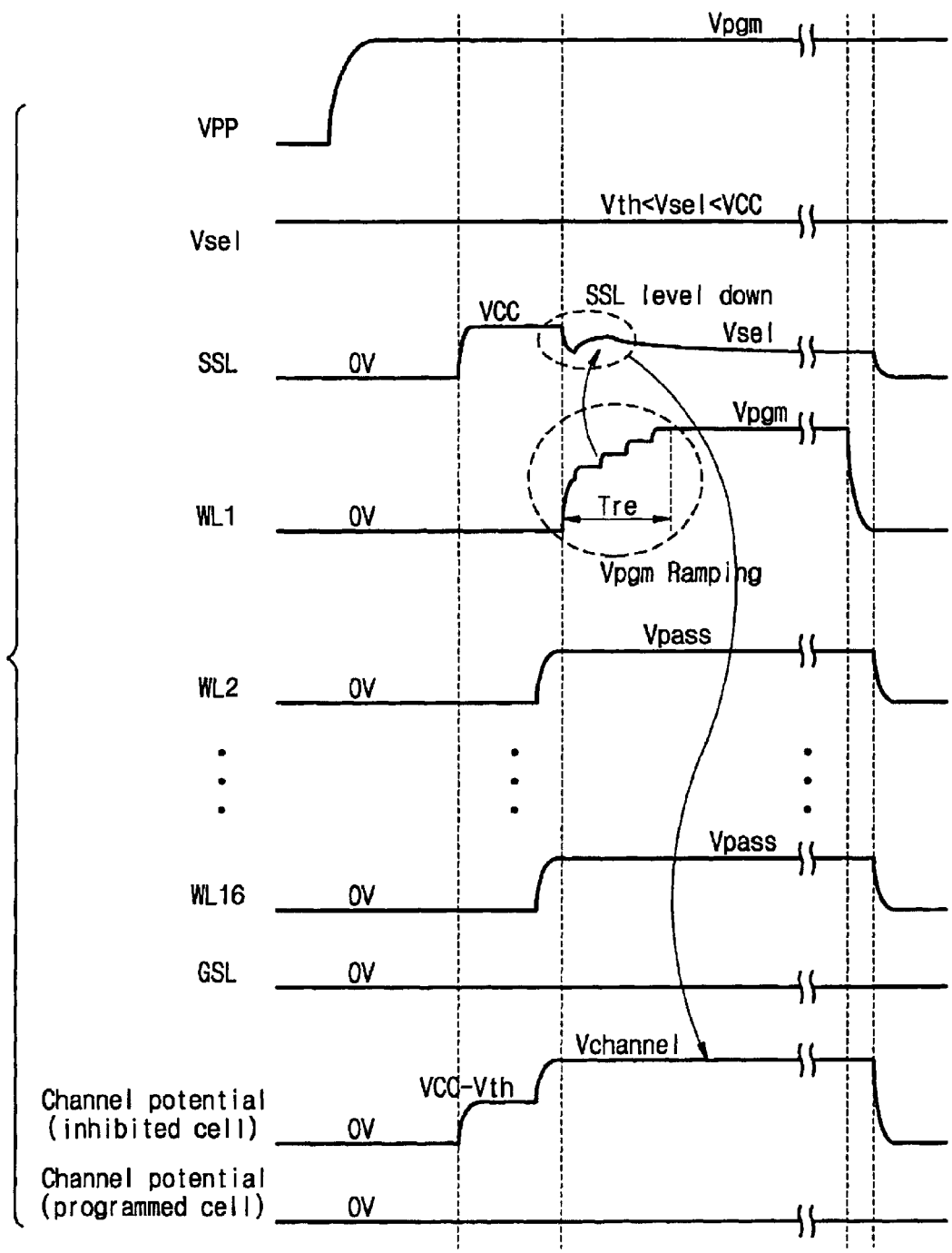
FIG. 4 is an example timing diagram of a program operation of the memory device of FIG. 3.

FIG. 4 is a timing diagram of a program operation of the memory device of FIG. 3.

A program operation of the flash memory device of the invention will specifically be described below. Cell transistors T1 to T16 and T17 to T32 are preferably erased to have zero or negative thresholds, prior to a substantial program operation, as known to those skilled in the art.

With reference to FIG. 3 and FIG. 4, in a program operation of the flash memory device, the power supply voltage VCC and the ground voltage VSS (or 0V) are applied to string select line SSL and ground select line GSL, respectively. Also, the power supply voltage VCC is applied to bit line BL1 corresponding to a program inhibited string (TS10, T1 to T16, TG10), and the ground voltage VSS is applied to the bit line BLn corresponding to a programmed string (TS11, T17 to T32, TG11).

An application of the power supply voltage VCC to the string select line SSL makes the string select transistor TS10 turn on such that channel voltages of the respective cell transistors T1 to T16 increase up to VCC−Vth, where Vth is a threshold voltage of string select transistor TS1.

Once the channel voltages of the respective cell transistors T1 to T16 go up to VCC−Vth, a source-gate voltage of string select transistor TS10 cannot exceed its threshold voltage Vth. So, string select transistor TS10 is substantially shut off. This results in an electrical isolation between the cell transistors T1 to T16 and the bit line BL1. In addition, since the ground voltage VSS is applied to the ground select line GSL, the ground select transistor TG10 becomes turned-off. Accordingly, channels of the cell transistors T1 to T16 are in a floating state.

In such a state, if a pass voltage Vpass is applied to the word lines WL2 to WL16 connected to non-programmed memory cell transistors T2 to T16, and T18 to T32, channel voltages of respective cell transistors T2 to T16, all of which are in a floating state, are boosted by a capacitive coupling between the word lines WL2 to WL16 and the cell transistors T1 to T16. This leads to a decrease in a voltage difference between floating gates of the program inhibited cell transistors T1 to T16 and their channels so as to prevent an F-N tunneling therebetween. As a result, the program inhibited cell transistors T1 to T16 are still maintained in an erased state.

Thereafter, to program the memory cell transistor T17, a program voltage Vpgm is applied to the word line WL1 connected to the programmed cell transistor T17. Additionally, the string select line driver 300 supplies the string select line SSL with the select voltage Vsel limited below the power supply voltage VCC before or upon the application of the program voltage Vpgm. The select voltage Vsel is lower than the power supply voltage VCC, and a difference between the select voltage Vsel and the power supply voltage VCC is at least as much as a coupling voltage Vcpl between the string select line SSL and the word line WL1. The select voltage Vsel is also higher than a threshold voltage of the string select transistor TS10. The program voltage Vpgm, supplied into the word line WLi, increases in a staircase form. In this case, it is desirable that a rise time of the program voltage Vpgm is $\frac{1}{10}$ to $\frac{2}{10}$ (or 10 to 20%) the program time of the flash memory device.

As described above, during a program operation of a selected cell transistor, since the string select line SSL is supplied with the select voltage Vsel lower than VCC−Vcpl, the program voltage Vpgm is gradually increased in a staircase form. This, even in a highly integrated device, keeps the string select transistor TS1 from being turned on due to the capacitive coupling between the string select line SSL and a signal line (e.g., WLi) adjacent thereto, so that channel voltages Vchannel of the program inhibited cell transistors T1 to T16 do not decrease. Accordingly, program inhibition failure of the program inhibited cell transistors T1 to T16 due to the channel voltage decrease thereof can be prevented.

Figure 5:
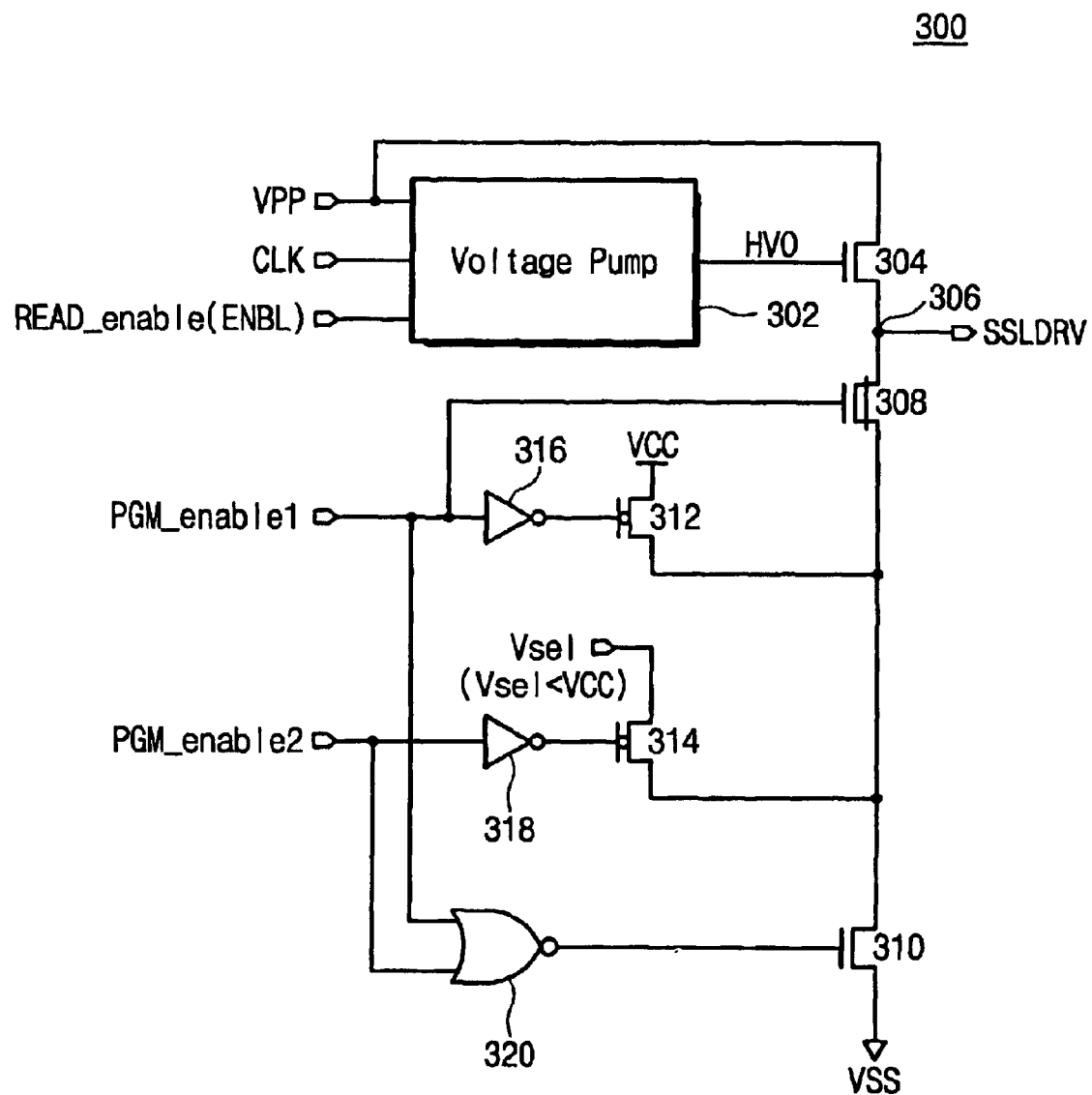
FIG. 5 is a circuit diagram of an example string select line driver for use in the memory device of FIG. 3.

FIG. 5 is a circuit diagram illustrating an example string select line driver 300 that can be used in the memory device of FIG. 3.

Referring to FIG. 5, the string select line driver 300 includes a voltage pump 302, enhancement type NMOS transistors 304 and 310, a depletion type NMOS transistor 308, enhancement type PMOS transistors 312 and 314, CMOS inverters 316 and 318, and a NOR gate 320.

A gate electrode (i.e., a control electrode) of the transistor 304 is coupled to an output terminal of the voltage pump 302, and a source-drain channel (i.e., a current path) of the transistor 304 is coupled between an internally boosted voltage VPP and a global string select line 306. Current paths of the transistors 308 and 310 are coupled in series between the global string select line 306 and the ground voltage VSS. A control electrode of the transistor 308 is coupled to a program enable signal PGM_enable1 ("first program enable signal"). A current path of the transistor 312 is coupled between a junction node of current paths of the transistors 308 and 310 and the power supply voltage VCC. A current path of the transistor 314 is coupled between the junction node of current paths of the transistors 308 and 310 and the select voltage Vsel, which is lower than the power supply voltage VCC.

An input terminal of the inverter 316 is coupled to the program enable signal PGM_enable1, and an output terminal of the inverter 316 is coupled to a control electrode of the transistor 312. An input terminal of the inverter 318 is coupled to a program enable signal PGM_enable2 ("second program enable signal"), and an output terminal of the inverter 318 is coupled to a control electrode of the transistor 314. An output terminal of the NOR gate 320 is coupled to a control electrode of the transistor 310.

The voltage pump 302 receives the voltage VPP from the high voltage pump circuit 200, a clock signal CLK from a clock generator (not shown), and a read enable signal READ_enable (or ENBL) from a control block (not shown), and provides a predetermined voltage HVO.

Figure 6:
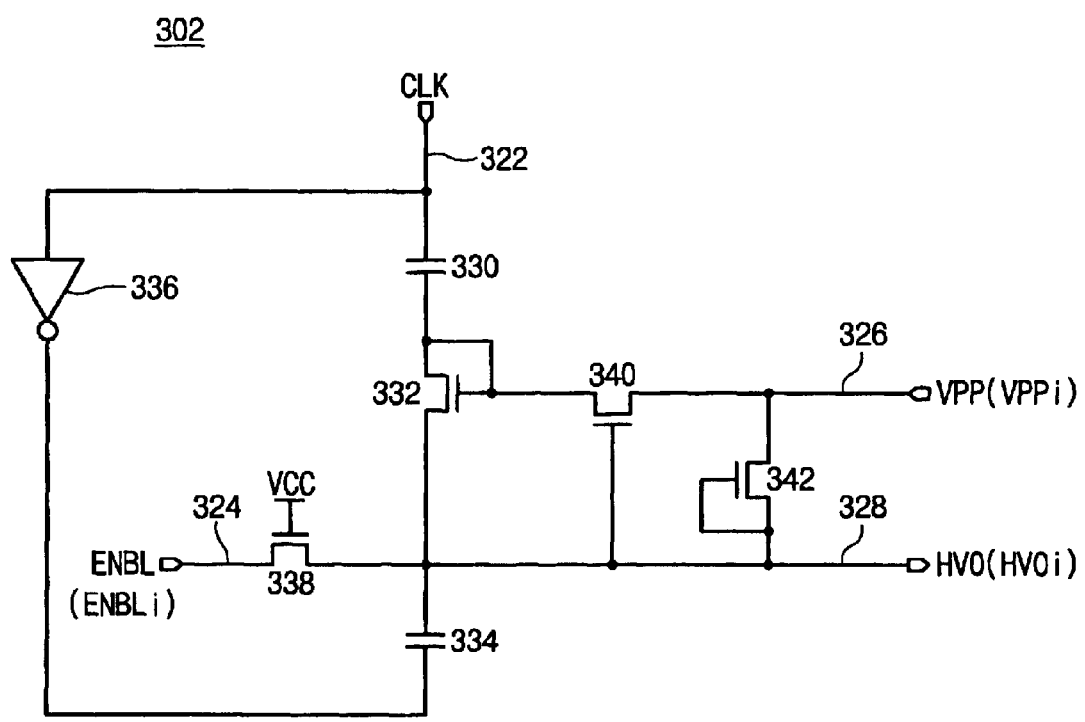
FIG. 6 is a circuit diagram of an example high voltage pump for use in the driver of FIG. 5.

FIG. 6 is a circuit diagram illustrating an example voltage pump 302 that can be used in the string select line driver of FIG. 5.

Referring to FIG. 6, the voltage pump 302 includes input terminals 322, 324 and 326, an output terminal 328, CMOS capacitors 330 and 334, NMOS transistors 332, 338, 340 and 342, and a CMOS inverter 336.

The input terminals 322, 324 and 326 are supplied with the clock signal CLK, the read enable signal ENBL, the boosted voltage VPP, respectively. The output terminal 328 provides the output voltage HVO. The clock signal CLK swings between two voltage levels VSS (or 0V) and VCC.

A first electrode of the capacitor 330 is coupled to input terminal 322, and a second electrode of the capacitor 330 is coupled in common to a first terminal of a current path of the transistor 332 and a control electrode of the transistor 332. A first terminal of capacitor 334, a first terminal of a current path of the transistor 338 and an output terminal HVO are commonly coupled to a second terminal of the current path of the transistor 332. A second terminal of the current path of the transistor 338 is coupled to the input terminal 324, and a control electrode of the transistor 338 is coupled to the power supply voltage VCC.

An input terminal of the inverter 336 is coupled to the input terminal 322, and an output terminal of the inverter 336 is coupled to a second electrode of the capacitor 334. A current path of the transistor 340 is coupled between the input terminal 326 and the control electrode of the transistor 332, and a control electrode of the transistor 340 is coupled to the output terminal 328. A current path of the transistor 342 is coupled between the input terminal 326 and the output terminal 328, and a control electrode of the transistor 342 is coupled to the output terminal 328.

The capacitor 334 and the inverter 336 function as switching voltage stabilization circuits.

Clock signal CLK and an output signal of the inverter 336 are applied to capacitors 330 and 334, respectively, and phases of the output signal of the inverter 336 and the clock signal CLK are opposite to each other.

When clock signal CLK goes up to power supply voltage VCC, a coupling voltage of the capacitor 330 is transferred to output terminal 328 through transistor 332. The output terminal 328 is discharged through the capacitor 334 decoupled by output signal of inverter 336 that is held at ground voltage VSS; allowing a switching voltage level of output terminal 328 to be lowered. When clock signal CLK goes down to ground voltage VSS so that capacitor 330 is decoupled, capacitor 334 applies its coupling voltage to output terminal 328 by the output signal of inverter 336 that is held at power supply voltage VCC. Consequently, a switching voltage stabilization circuit, including the capacitor 334 and inverter 336, discharges the output terminal 328 while clock signal CLK is held at power supply voltage VCC, and charges the output terminal 328 while clock signal CLK is held at ground voltage VSS, so that the output voltage HVO on the output terminal 328 may be constantly maintained.

Figure 7:
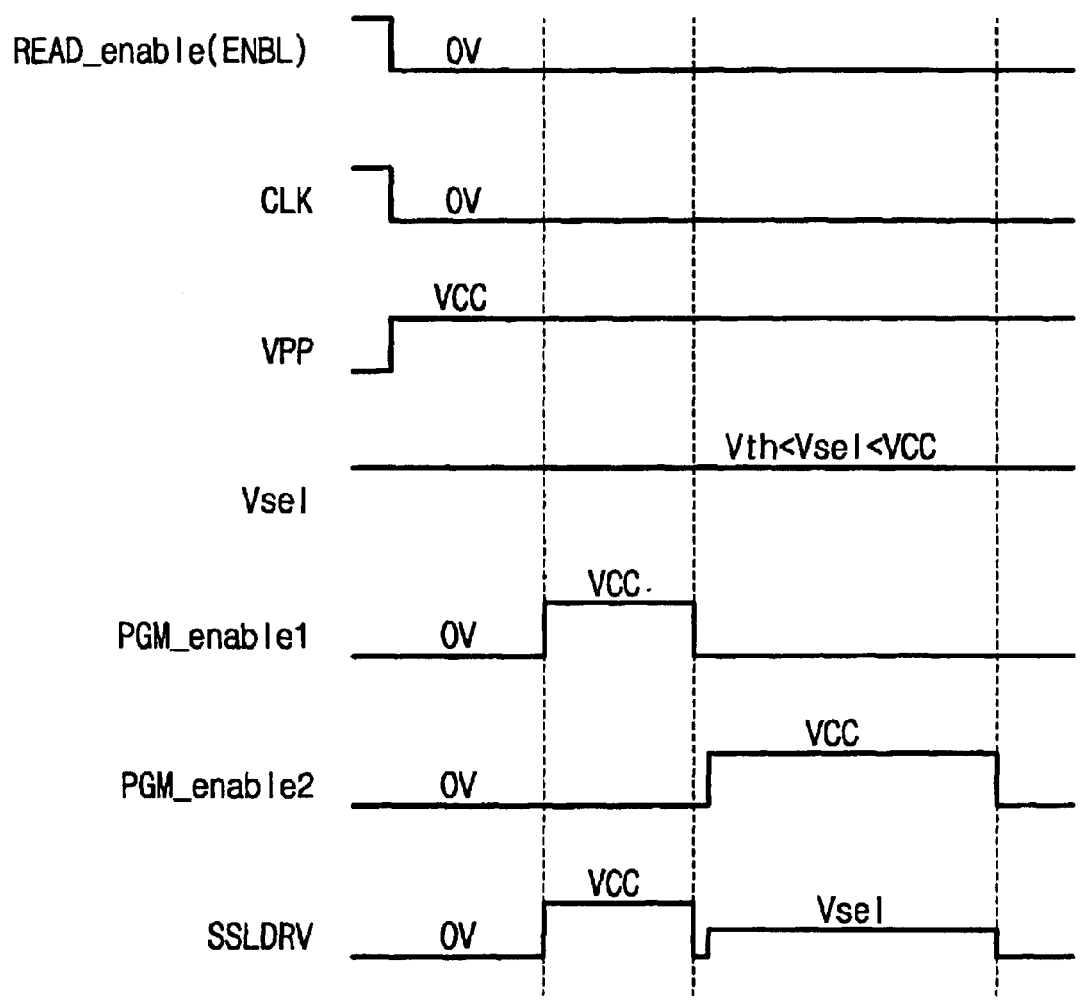
FIG. 7 is an example timing diagram of the string select line driver of FIG. 5.

FIG. 7 shows an operational timing of the string select line driver 300 of FIG. 5.

With reference to FIGS. 4 to 7, the read enable signal READ_enable (ENBL) and clock signal CLK are in their inactive states during a program operation, that is, voltage pump 302 does not operate. At this time, the string select line driver 300 is supplied with power supply voltage VCC from the high voltage pump circuit 200.

To begin with, both first and second program enable signals PGM_enable1 and PGM_enable2 are in an inactive state at the beginning of a program operation. An output of the NOR gate 320 goes to a power supply voltage VCC. The transistor 310 is turned on, and thereby the global string select line 306 or a global string select line driving signal SSLDRV is lowered to the ground level VSS or 0V.

If the first program enable signal PGM_enable1 is activated to the power supply voltage VCC, the transistor 310 is turned off and the transistors 308 and 312 are turned on. The global string select line 306 or the global string select line driving signal SSLDRV is increased up to the power supply voltage VCC. The power supply voltage VCC on the global string select line 306 is transferred into the string select line of the selected memory cell block through the row decoder 600 (FIG. 3).

Thereafter, the first program enable signal PGM_enable1 is inactivated and the second program enable signal PGM_enable2 is activated to the power supply voltage VCC. The second program enable signal PGM_enable2 is activated when the program voltage Vpgm is applied to the selected word line (e.g., WL1 of FIG. 4). At this time, the transistor 312 is turned off, and the transistor 314 is turned on. The global string select line 306 or the global string select line driving signal SSLDRV is lowered to the select voltage Vsel. The select voltage Vsel on the global string select line 306 is transferred into the string select line SSL of the selected memory cell block through the row decoder 600. It is preferred that the select voltage Vsel is lower than the power supply voltage VCC, and a difference between the select voltage Vsel and the power supply voltage VCC is at least as much as the coupling voltage between the string select line SSL and the word line WL1, and higher than the threshold voltage of the string select transistor TS10.

As described above, according to embodiments of the present invention, since a voltage Vsel below VCC−Vcpl is applied to the string select line SSL, the string select transistor TS1 is not turned on by the capacitive coupling between the string select line SSL and a signal line (e.g., WL1) adjacent thereto during a program operation of the selected cell transistor even in a highly integrated device. This makes it possible to prevent a decrease in a channel voltage Vchannel of the program inhibited cell transistors T1 to T16. Accordingly, the program inhibited cell transistors T1 to T16 may be prevented from undergoing a failure in a program inhibition due to a decrease in the channel voltage.

Figure 8:
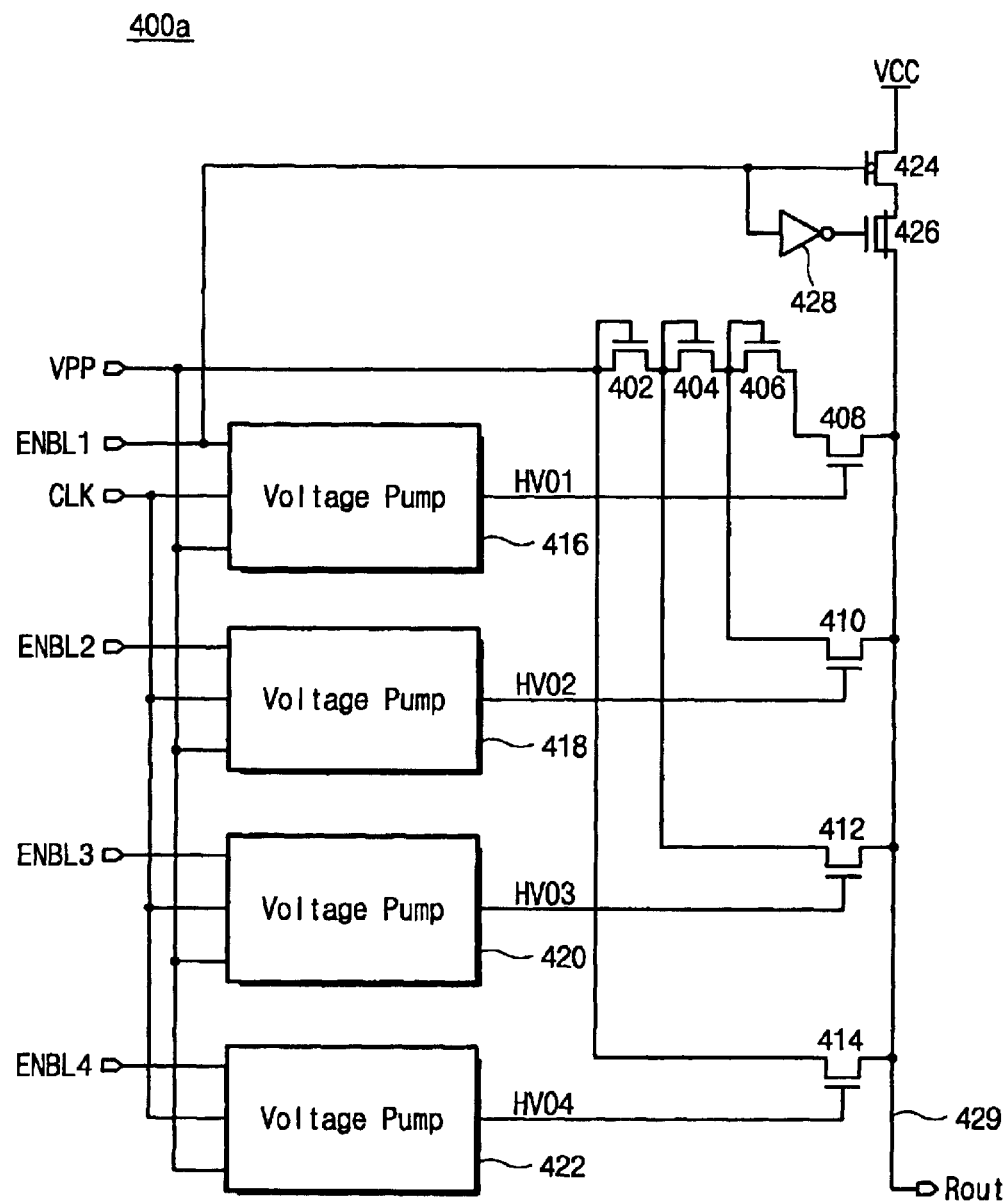
FIG. 8 is a circuit diagram of an example of a high voltage ramp circuit for use in the memory device of FIG. 3.

FIG. 8 is a circuit diagram of an example high voltage ramp circuit 400 that can be used in the memory device of FIG. 3. Referring to FIG. 8, a high voltage ramp circuit 400a includes a load circuit (or a voltage clamp circuit) having three load elements 402, 404, and 406; four enhancement type NMOS transistors 408, 410, 412, and 414; four voltage pumps 416, 418, 420, and 422; an enhancement type PMOS transistor 424; a depletion type NMOS transistor 426; and an inverter 428.

Referring again to FIG. 3, the row decoder 500 drives the global word lines S1 to S16 corresponding to the word lines WL1 to WL16, respectively in response to the row address RADD. In particular, the row pre-decoder 500 transfers the output voltage Rout of the high voltage ramp circuit 400 into a selected global word line Si. The voltage Rout on the selected global word line Si is transferred into a selected word line WLi (e.g., WL1) through the row decoder 600. Consequently, the output voltage Rout of the high voltage ramp circuit 400 is transferred to the selected word line WLi (e.g., WL1) during the program operation.

Referring again to FIG. 8, the high voltage ramp circuit 400a receives the voltage VPP (or a program voltage Vpgm), enable signals ENBL1, ENBL2, ENBL 3, and ENBL4, and a clock signal CLK, from the high voltage pump circuit 200, a control block (not shown), and a clock generator (not shown), respectively. The enable signals ENBL1, ENBL2, ENBL3, and ENBL4 are applied to the voltage pumps 416, 418, 420, and 422, respectively. Each of the voltage pumps 416, 418, 420, and 422 has the same structure as the circuit 302 shown in FIG. 6.

Diode-connected NMOS transistors 402, 404, and 406 are used as the load elements of the load circuit. Current paths of the transistors 402, 404, and 406 are connected in series. One end of the cascaded current paths of the transistors 402, 404, and 406 is connected to the high voltage VPP.

A current path of the switch transistor 408 is connected between the other end of the cascaded current paths of the transistors 402, 404, and 406 and the output terminal 429. And, a control electrode of the switch transistor 408 is connected to an output terminal HVO1 of the voltage pump 416. A current path of the switch transistor 410 is connected between a connection node of the current paths of the transistors 404 and 406 and the output terminal 429. A control electrode of the switch transistor 410 is connected to an output terminal HVO2 of the voltage pump 418. A current path of the switch transistor 412 is connected between a connection node of the current paths of the transistors 402 and 404 and the output terminal 429. A control electrode of the switch transistor 412 is connected to an output terminal HVO3 of the voltage pump 420. A current path of the switch transistor 414 is connected between the high voltage VPP and the output terminal 429. A control electrode of the switch transistor 414 is connected to an output terminal HVO4 of the voltage pump 422.

Current paths of the transistors 424 and 426 are connected in series between the power supply voltage VCC and the output terminal 429. Both a control electrode of the transistor 424 and an input terminal of the inverter 428 are coupled to the enable signal ENBL1. An output terminal of the inverter 428 is coupled to a control electrode of the transistor 426.

Figure 9:
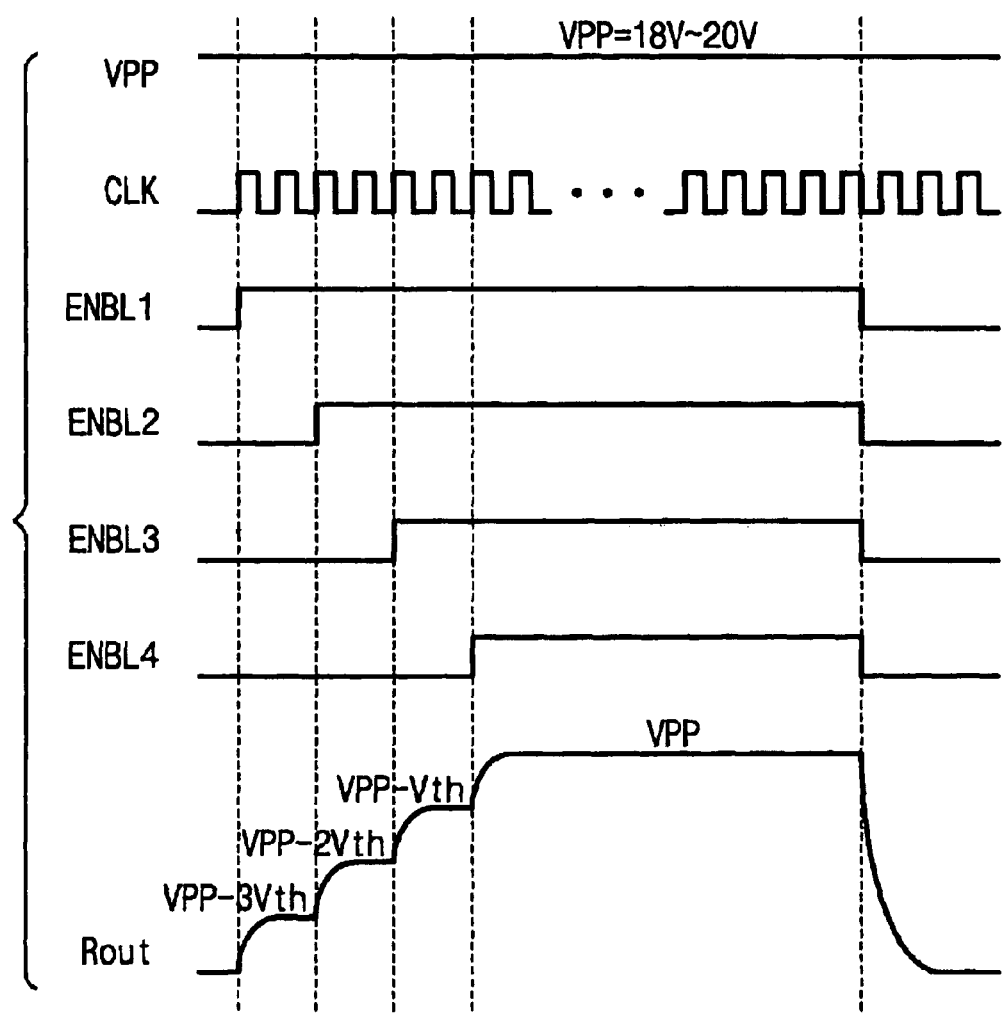
FIG. 9 is an example timing diagram of an operation of the circuit of FIG. 8.

FIG. 9 is a timing diagram of an operation of the high voltage ramp circuit 400a of FIG. 8. Referring to FIGS. 8 and 9, the enable signals ENBL1 to ENBL4 are sequentially activated during the program operation. Activating periods of the enable signals ENBL1 to ENBL4 partially overlap each other.

Each of the voltage pumps 416, 418, 420, and 422 supplies a supply voltage VPP+Vth in response to the corresponding enable signal ENBL1, ENBL2, ENBL3, or ENBL4 during the program operation. In this connection, VPP is about 18–20V, and Vth is a threshold voltage of the transistor 402, 404, or 406 as the load element. On the other hand, the voltage pump 416 may generate a voltage VPP−2Vth; the voltage pump 418 may generate a voltage VPP−Vth; the voltage pump 420 may generate a voltage VPP; and the voltage pump 422 may generate a voltage VPP+Vth.

As the enable signals ENBL1 to ENBL4 are sequentially activated during the program operation, the voltage Rout on the selected global word line Si is increased in a staircase form, as shown in FIG. 9. Since the voltage Rout on the selected global word line Si is transferred into the selected word line WLi (e.g., WL1) through the row decoder 600, the program voltage transferred into selected word line WLi (e.g., WL1) during the program operation is increased in a staircase form. At this time, it is preferred that a rise time of the program voltage is $\frac{1}{10}$ to $\frac{2}{10}$ (or 10–20%) a program time. Such a gentle increase in the program voltage leads to a decrease in a capacitive coupling between the string select line SSL and the word line (e.g. WL1) adjacent thereto. As a result, the string select transistor TS1 is prevented from being turned on.

As described above, according to embodiments of the present invention, when a voltage Vsel below the voltage VCC−Vcpl is applied to the string select line SSL during the program operation of the selected cell transistor, the program voltage Vpgm starts to gently increase in a staircase form. Accordingly, it is possible to alleviate the program interference problem caused by a parasitic capacitor existing between the string select line SSL and the word line (e.g., WL1). That is, the program inhibition characteristic of unselected memory cell transistors may be improved, and the possibility of program failure may be reduced.

Figure 10:
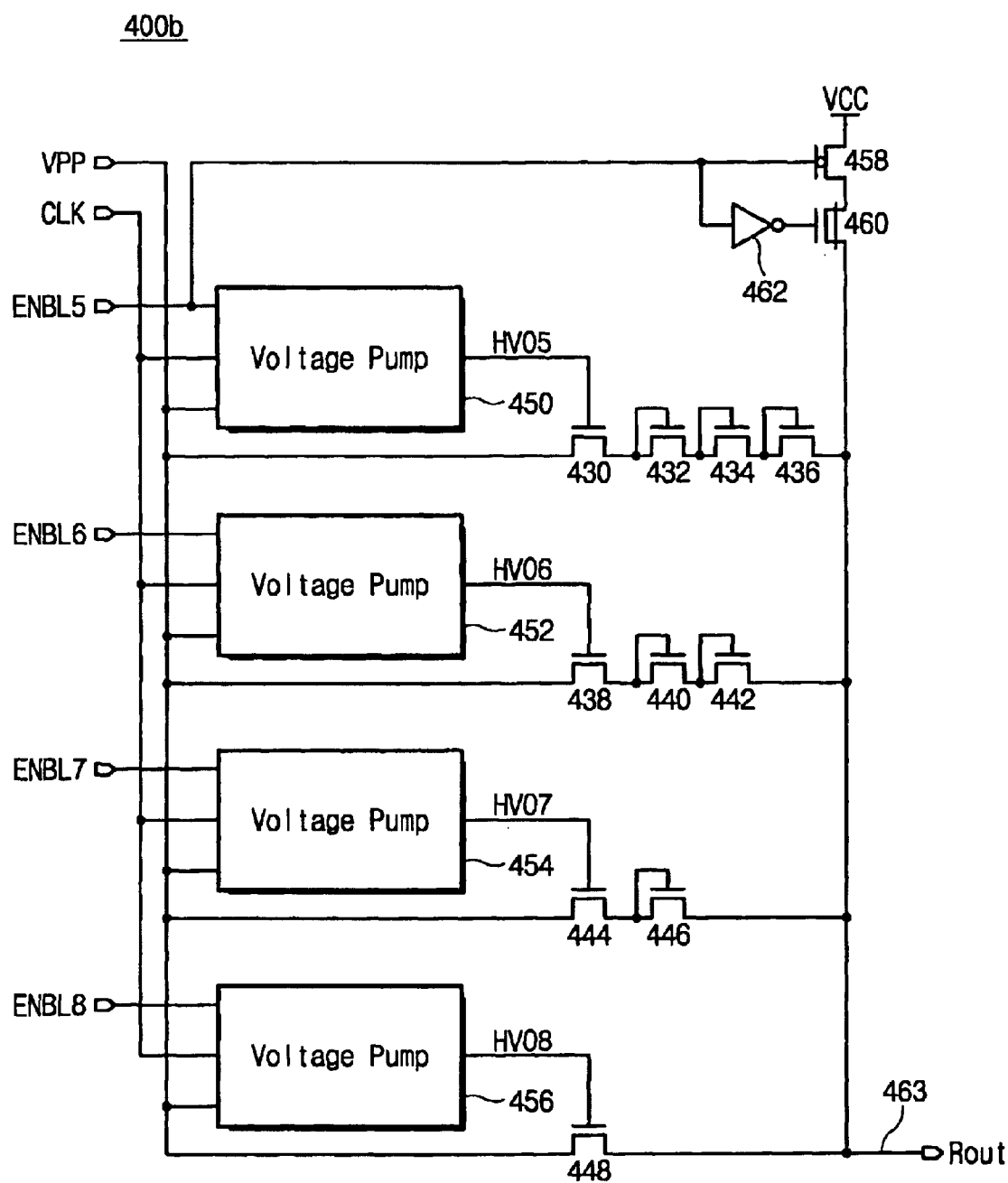
FIG. 10 is a circuit diagram of another example of a high voltage ramp circuit for use in the memory device of FIG. 3.

FIG. 10 is a circuit diagram of another example of a high voltage ramp circuit 400 that can be used in the memory circuit of FIG. 3. Referring to FIG. 10, the high voltage ramp circuit 400b includes a first load circuit (or a voltage clamp circuit) having three load elements 432, 434, and 436; a second load circuit having two load elements 440 and 442; a third load circuit having a single load element 446; four enhancement type NMOS transistors 430, 438, 444, and 448; four voltage pumps 450, 452, 454, and 456; an enhancement type PMOS transistor 458; a depletion type NMOS transistor 460; and an inverter 462.

Like the circuit of FIG. 8, the high voltage ramp circuit 400b receives a high voltage VPP (or a program voltage Vpgm), enable signals ENBL5, ENBL6, ENBL7, and ENBL8, and a clock signal CLK, from the high voltage pump circuit 200, a control block (not shown), and a clock generator (not shown), respectively. The enable signals ENBL5 to ENBL8 correspond to the enable signals ENBL1 to ENBL4 of FIGS. 8 and 9, and are applied to the voltage pumps 450, 452, 454, and 456, respectively.

Each of the voltage pumps 450, 452, 454, and 456 can have the same structure as the circuit 302 shown in FIG. 6. Diode-connected NMOS transistors 432, 434, 436, 440, 442, and 446 are used as the load elements.

Current paths of the transistors 432, 434, and 436 are connected in series. One end of the cascaded current paths of the transistors 432, 434, and 436 is connected to the output terminal 463. A current path of the switch transistor 430 is connected between the other end of the cascaded current paths of the transistors 432, 434, and 436 and the high voltage VPP. And, a control electrode of the switch transistor 430 is connected to an output terminal HVO5 of the voltage pump 450.

Current paths of the transistors 440 and 442 are also connected in series, and one end of the cascaded current paths of the transistors 440 and 442 is connected to the output terminal 463. A current path of the switch transistor 438 is connected between the other end of the cascaded current paths of the transistors 440 and 442 and the high voltage VPP. And, a control electrode of the switch transistor 438 is connected to an output terminal HVO6 of the voltage pump 452.

One end of a current path of the transistor 446 is coupled to the output terminal 463. A current path of the switch transistor 444 is connected between the other end of the current path of the transistor 446 and the high voltage VPP. A control electrode of the switch transistor 444 is connected to an output terminal HVO7 of the voltage pump 454.

A current path of the switch transistor 448 is connected between the high voltage VPP and the output terminal 463. A control electrode of the switch transistor 448 is connected to an output terminal HVO8 of the voltage switch pump 456.

Current paths of the transistors 458 and 460 are connected in series between the power supply voltage VCC and the output terminal 463. Both the control electrode of the transistor 458 and an input terminal of the inverter 462 are connected to the enable signal ENBL5. An output terminal of the inverter 462 is coupled to a control electrode of the transistor 460.

The high voltage ramp circuit 400b of FIG. 10 operates with the same timing as that of the circuit 400a of FIG. 8. That is, a timing of the enable signals ENBL5 to ENBL8 is the same as that of the enable signals ENBL1 to ENBL4, and a waveform of the output signal Rout on the output terminal 463 is the same as that of the output signal Rout of FIGS. 8 and 9.

Figure 11:
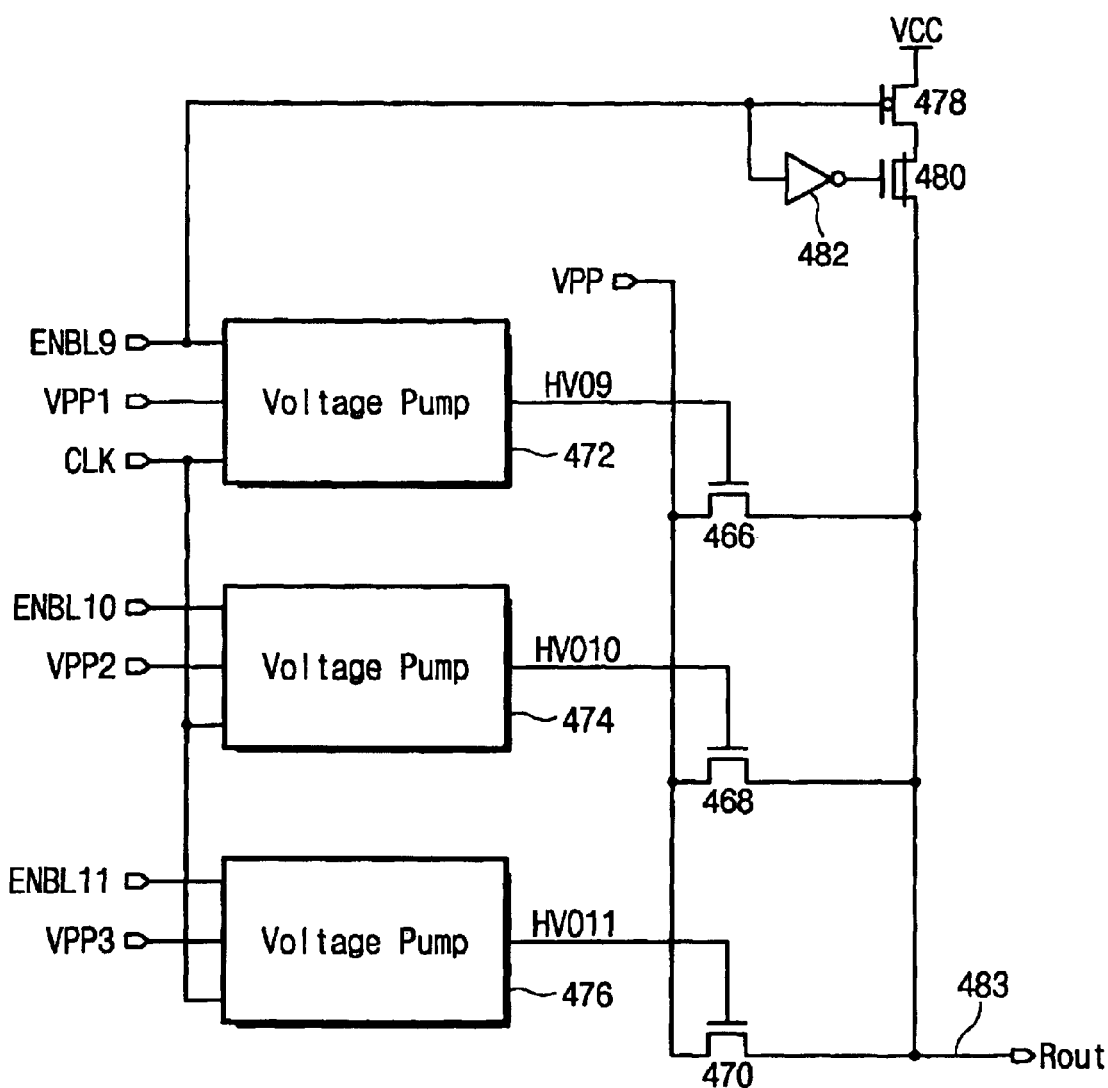
FIG. 11 is a circuit diagram of another example of a high voltage ramp circuit for use in the memory device of FIG. 3.

FIG. 11 is a circuit diagram of another example of a high voltage ramp circuit 400 that can be used with the memory circuit of FIG. 3. Referring to FIG. 11, the high voltage ramp circuit 400c includes three enhancement type NMOS transistors 466, 468, and 470; three voltage pumps 472, 474, and 476; an enhancement type PMOS transistor 478; a depletion type NMOS transistor 480; and an inverter 482.

The high voltage ramp circuit 400c receives different voltages VPP1, VPP2, and VPP3 from the high voltage pump 200 or the like. For instance, in one embodiment, the voltage VPP1 is 4–5V; the voltage VPP2 is 8–9V; and the voltage VPP3 is 18–20V. In addition, the high voltage ramp circuit 400c receives three enable signals ENBL9, ENBL10, and ENBL11 from a control block (not shown). The three enable signals ENBL9, ENBL10, and ENBL11 are provided to the voltage pumps 472, 474, and 476, respectively. The high voltage ramp circuit 400c receives a clock signal CLK from a clock generator (not shown), and the clock signal CLK is provided to the respective voltage pumps 472, 474, and 476.

A current path of the switch transistor 466 is connected between a high voltage VPP (e.g. 18–20V) and an output terminal 483. A control electrode of the switch transistor 466 is connected to an output terminal HVO9 of the voltage pump 472. A current path of the switch transistor 468 is connected between the high voltage VPP and the output terminal 483. A control electrode of the switch transistor 468 is connected to an output terminal HVO10 of the voltage pump 474. A current path of the switch transistor 470 is connected between the high voltage VPP and the output terminal 483. A control electrode of the switch transistor 470 is connected to an output terminal HVO11 of the voltage pump 476.

Each of the voltage pumps 472, 474, and 476 can have the same structure as the circuit 302 as shown in FIG. 6, for example.

In the voltage ramp circuit 400c, the current paths of the transistors 478 and 480 are connected in series between a power supply voltage VCC and the output terminal 483. A control electrode of the transistor 478 and an input terminal of the inverter 482 are commonly connected to the enable signal ENBL9. An output terminal of the inverter 482 is connected to a control electrode of the transistor 480.

Figure 12:
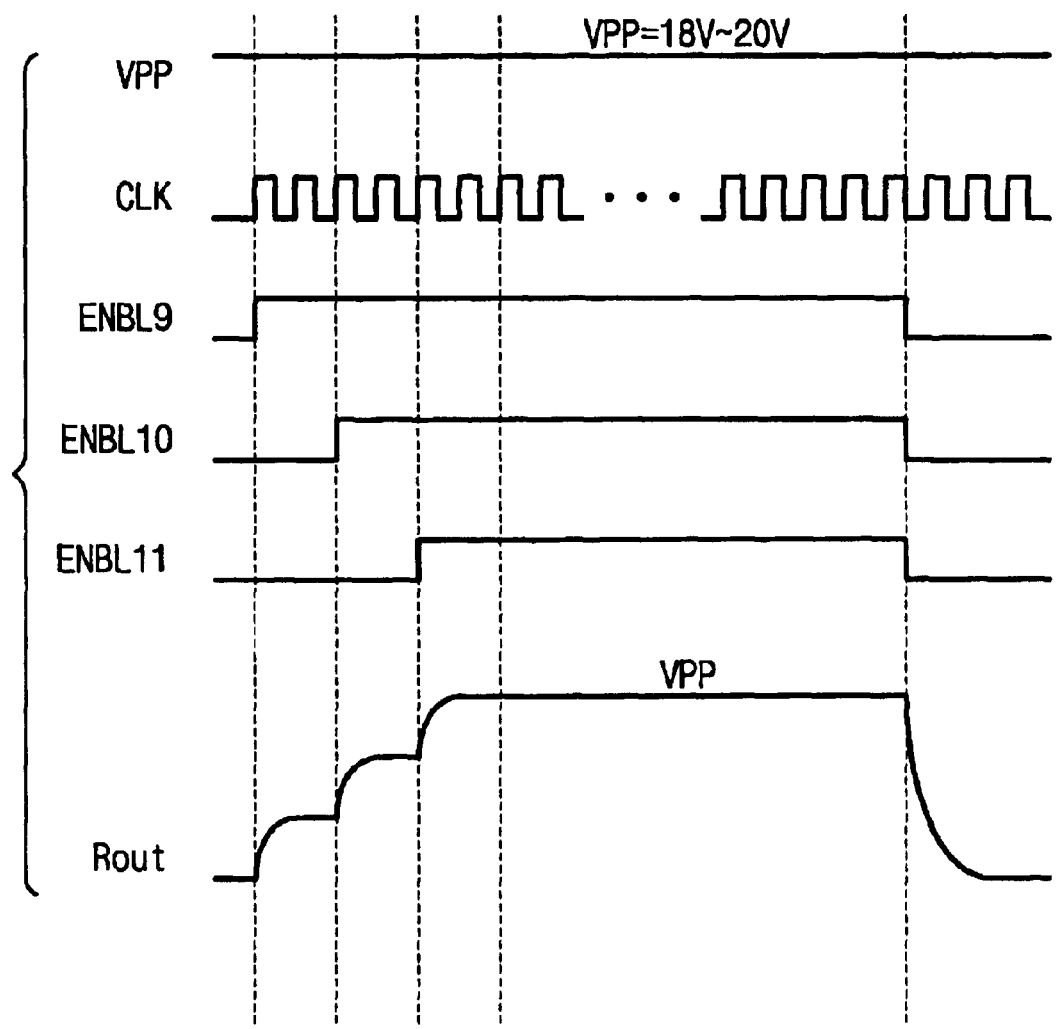
FIG. 12 is an example timing diagram of an operation of the circuit of FIG. 11.

FIG. 12 is a timing diagram of an operation of the high voltage ramp circuit 400c of FIG. 11. Referring to FIGS. 11 and 12, the enable signals ENBL9 to ENBL11 are sequentially activated. The activating periods of the enable signals ENBL9 to ENBL11 are partially overlapped each other.

Each of the voltage pumps 472, 474, and 476 supplies a supply voltage of the received voltage (VPP1, VPP2, or VPP3) plus a threshold voltage Vth in response to the corresponding enable signal ENBL9, ENBL10, or ENBL11 during a program operation. In this connection, Vth is a threshold voltage of the switch transistor 466, 468, or 470.

As the enable signals ENBL9 to ENBL11 are sequentially activated during the program operation, the voltage Rout on the selected global word line Si is increased in a staircase form, as shown in FIG. 12. Since the voltage Rout on the selected global word line Si is transferred into the selected word line WLi (e.g., WL1) through the row decoder 600, the program voltage transferred into the selected word line WLi (e.g., WL1) during the program operation is increased in a staircase form.

Figure 13:
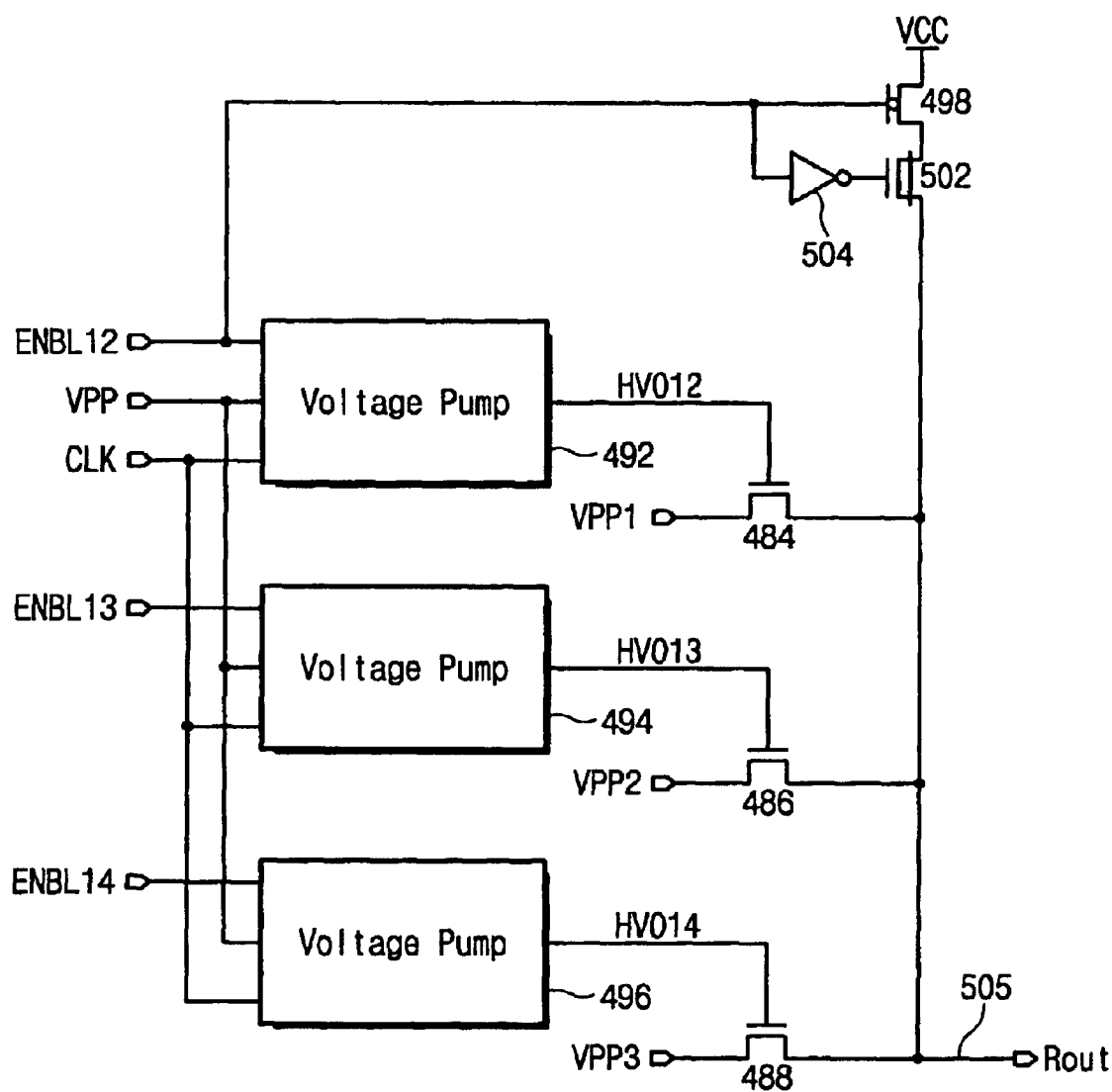
FIG. 13 is a circuit diagram of another example of a high voltage ramp circuit for use in the memory device of FIG. 3.

FIG. 13 is a circuit diagram of yet another example of the high voltage ramp circuit 400 that can be used in the memory device of FIG. 3. Referring to FIG. 13, like the circuit 400c of FIG. 11, the high voltage ramp circuit 400d includes three enhancement type NMOS transistors 484, 486, and 488; three voltage pumps 492, 494, and 496; an enhancement type PMOS transistor 498; a depletion type NMOS transistor 502; and an inverter 504.

The high voltage ramp circuit 400d receives different voltages VPP1, VPP2, and VPP3 from, for example, the high voltage pump 200 and the like. For instance, the voltage VPP1 is 4–5V; the voltage VPP2 is 8–9V; and the voltage VV3 is 18–20V. In addition, the high voltage ramp circuit 400d receives three enable signals ENBL12, ENBL13, and ENBL14 from a control block (not shown). The three enable signals ENBL12, ENBL13, and ENBL14 are provided to the voltage pumps 492, 494, and 496, respectively. The high voltage ramp circuit 400d receives a clock signal CLK from a clock generator (not shown), and the clock signal CLK is provided to the respective voltage pumps 492, 494, and 496.

A current path of the switch transistor 484 is connected between the voltage VPP1 and an output terminal 505. A control electrode of the switch transistor 484 is connected to an output terminal HVO12 of the voltage pump 492. A current path of the switch transistor 486 is connected between the voltage VPP2 and the output terminal 505. A control electrode of the switch transistor 486 is connected to an output terminal HVO13 of the voltage pump 494. A current path of the switch transistor 488 is connected between the voltage VPP3 and the output terminal 505. A control electrode of the switch transistor 488 is connected to an output terminal HVO14 of the voltage pump 496.

Each of the voltage pumps 492, 494, and 496 can have the same structure as the circuit 302 as shown in FIG. 6, for example.

Current paths of the transistors 498 and 502 are connected in series between a power supply voltage VCC and the output terminal 505. A control electrode of the transistor 498 and an input terminal of the inverter 504 are commonly connected to the enable signal ENBL12. An output terminal of the inverter 504 is coupled to a control electrode of the transistor 502.

The high voltage ramp circuit 400d operates with the same timing as that of the circuit 400c of FIG. 11. That is, a timing of the enable signals ENBL12 to ENBL14 is the same as that of the enable signals ENBL9 to ENBL11 of FIGS. 11 and 12. In addition, a waveform of the output signal Rout on the output terminal 505 is the same as that of the output signal Rout of FIGS. 11 and 12.

Figure 14:
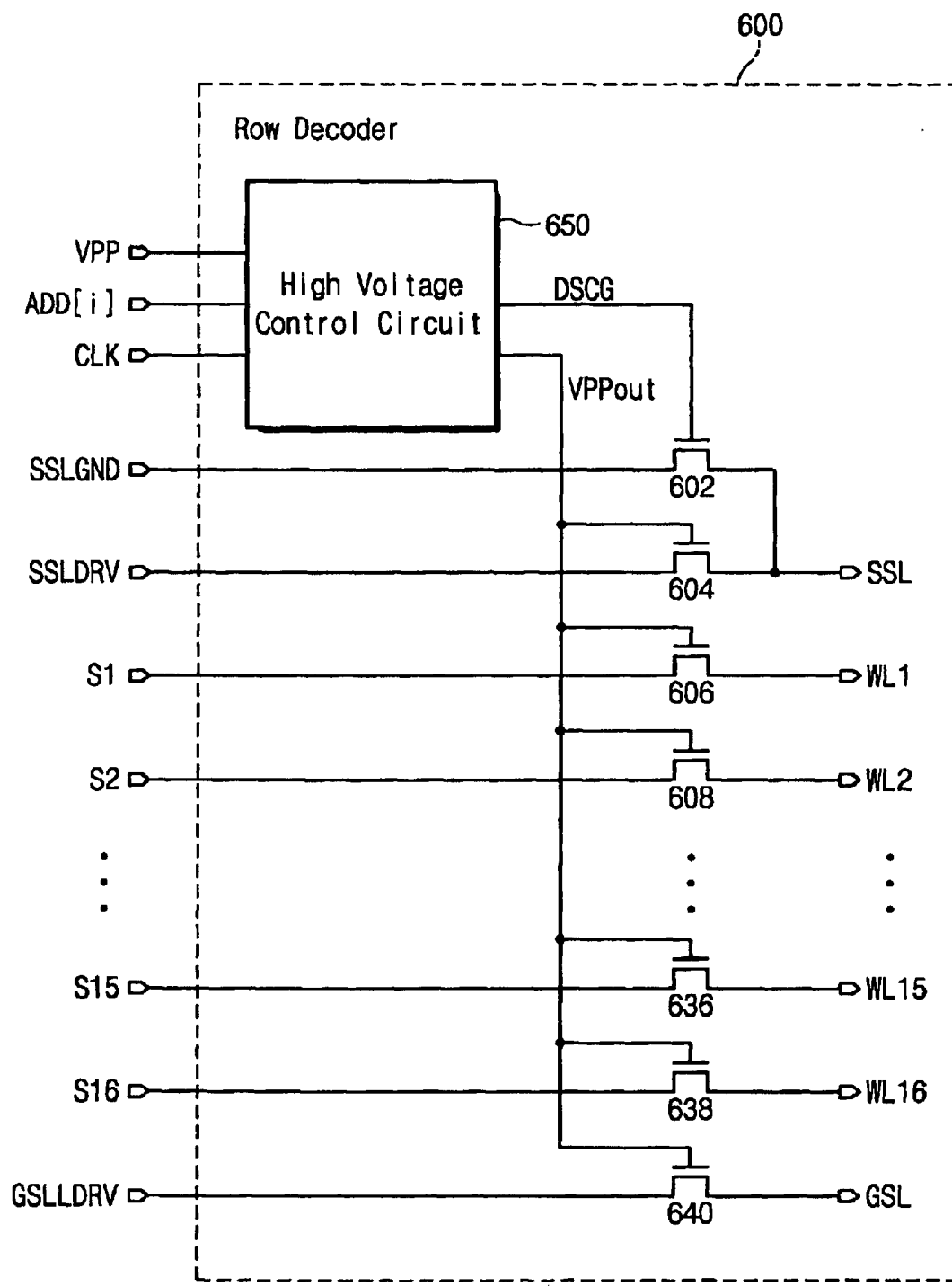
FIG. 14 is a circuit diagram of an example low decoder for use in the memory device of FIG. 3.

FIG. 14 is a circuit diagram of an example row decoder 600 that can be used in the memory circuit of FIG. 3. Referring to FIG. 14, the row decoder 600 includes a high voltage control circuit 650 and NMOS transistors 602, 604, 606, 608, 636, 638, and 640.

Figure 15:
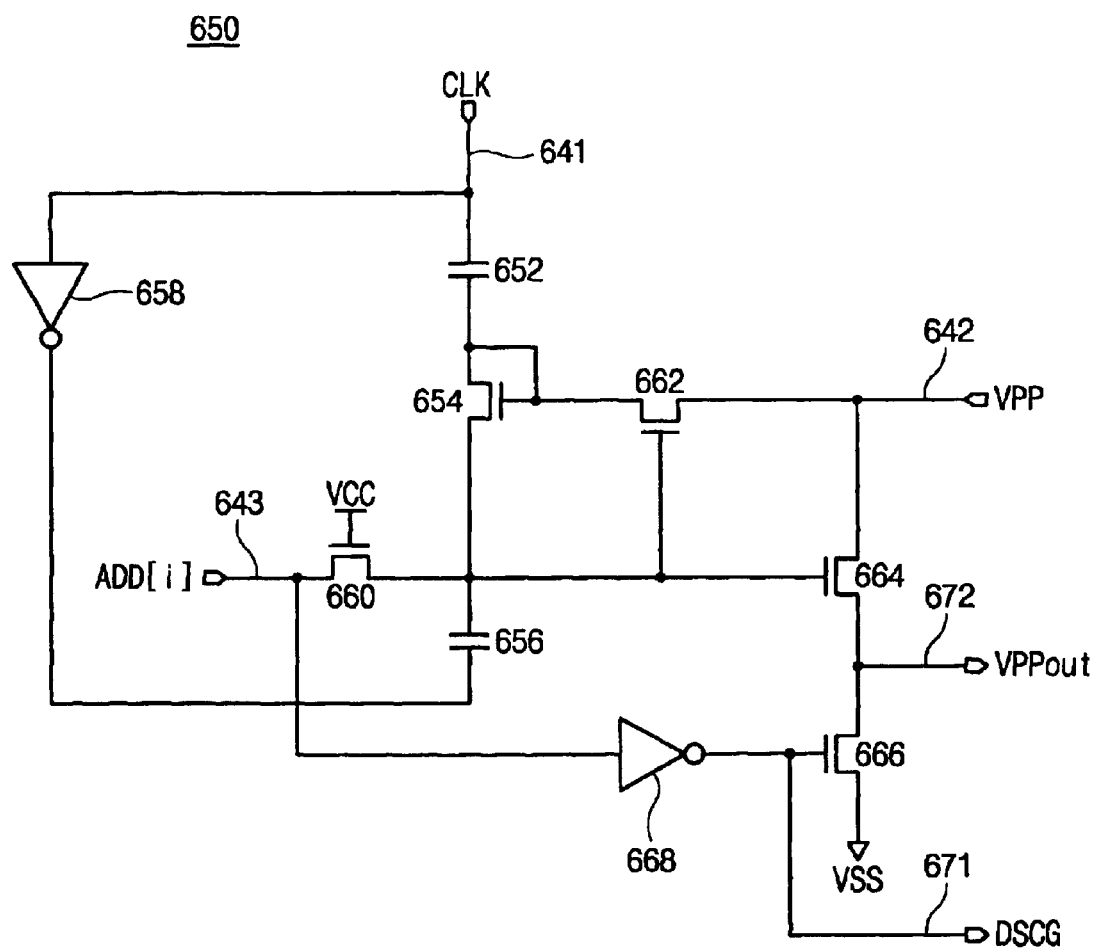
FIG. 15 is a circuit diagram of an example high voltage control circuit for use in the decoder of FIG. 14.

FIG. 15 is a circuit diagram of an example high voltage control circuit 650 that can be used in the row decoder 600 of FIG. 14. Referring to FIG. 15, the high voltage control circuit 650 includes input terminals 641, 642, and 643; capacitors 652 and 656; NMOS transistors 654, 660, 662, 664, and 666; inverters 658 and 668; and output terminals 671 and 672.

The input terminals 641, 642, and 643 receive a clock signal CLK, a high voltage VPP, and an address signal ADD[i], respectively. The output signals 671 and 672 provide a discharge signal DSCG and a predetermined output voltage VPPout (e.g., Vpgm+Vth), respectively.

A first electrode of the capacitor 652 is coupled to the input terminal 641, and a second electrode of the capacitor 652 is connected in common to one end of a current path of the transistor 654 and a control electrode of the transistor 654. The other end of the current path of the transistor 654 is connected in common to a first electrode of the capacitor 656, one end of a current path of the transistor 660, and control electrodes of the transistors 662 and 664. The other end of the current path of the transistor 660 is coupled to the input terminal 643. Also, a control electrode of the transistor 660 is coupled to the power supply voltage VCC.

An input terminal of the inverter 658 is coupled to the input terminal 641, and an output terminal of the inverter 658 is coupled to the second electrode of the capacitor 656. A current path of the transistor 662 is connected between the input terminal 642 and the transistor 654. A current path of the transistor 664 is connected between the input terminal 642 and the output terminal 672. A current path of the transistor 666 is connected between the output terminal 672 and ground voltage VSS. An input terminal of the inverter 668 is connected to the input terminal 643, and an output terminal of the inverter 668 is connected in common to a control electrode of the transistor 666 and the output terminal 671.

Constituent elements 652, 654, 656, 658, 660, 662, and 664 of the high voltage control circuit 650 of FIG. 15 perform the same function as the voltage pump of FIG. 6. The rest constituent elements 666 and 668 discharge the output terminal 672 when the address signal ADD[i] is inactivated.

Referring again to FIG. 14, a current path of the transistor 602 is connected between a string select line ground signal SSLGND of ground voltage level and the string select line SSL. In addition, a control electrode of the transistor 602 is connected to a discharge signal DSCG. If the discharge signal DSCG is activated, the string select line SSL is discharged down to the ground voltage level.

A current path of the transistor 604 is connected between the global string select line driving signal SSLDRV generated from the string select line driver 300 and the string select line SSL. And, a control electrode of the transistor 604 is connected to the high voltage VPPout generated from the high voltage control circuit 650. Each of current paths of the transistors 604 to 640 is connected between the respective global word lines S1 to S16 driven from the row decoder 500 or the global ground select line driving signal GSLDRV, and the respective word lines WL1 to WL15 or the ground select line GSL. In addition, control electrodes of the transistors 604 to 640 are connected in common to the high voltage VPPout generated from the high voltage control circuit 650.

The row decoder 600 transfers voltages on the global string select line GSSL, the global word line S1 to S16, and the global ground select line GGSL into the string select line SSL on the cell array 100, the word lines WL1 to WL16, and the ground select line GSL, respectively in response to the address signal ADD[i].

As described above, according to embodiments of the present invention, as the voltage Vsel below the voltage VCC−Vcpl is applied to the string select line during the program operation of the selected cell transistor, the program voltage Vpgm is gently increased in a staircase form. Thus, the string select transistor is not turned on by the capacitive coupling between the string select line and a signal line adjacent thereto even in a highly integrated device. This makes it possible to prevent a decrease in a channel voltage of the program inhibited cell transistors when the program voltage Vpgm is applied. Consequently, according to embodiments of the present invention, the program inhibited cell transistors may be prevented from undergoing a failure in a program inhibition due to a decrease in the channel voltage.

Specific examples of embodiments of the, invention can include for example, as mentioned above, a non-volatile integrated circuit memory device that includes a first select line, a first select transistor, a word line adjacent to and disposed in parallel with the first select line, a non-volatile memory cell transistor, a second select line, a second select transistor, and a high voltage pump circuit. Additionally, embodiments of the invention may have additional features, such as those discussed below.

The first select transistor has a control electrode coupled to the first select line, and a current path whose one side is coupled to a bit line. A control electrode of the non-volatile memory cell transistor is coupled to the word line. One side of a current path of the memory cell transistor is coupled to the other side of the current path of the first select transistor. A control electrode of the second select transistor is coupled to the second select line. One side of a current path the second select transistor is coupled to the other side of the current path of the memory cell transistor, and the other-end side of the current path of the second select transistor is grounded.

The high voltage pump circuit generates a program voltage (Vpgm) that has a predetermined rising slope and is higher than a power supply voltage (VCC), during a program operation of a non-volatile memory cell transistor.

In particular, the non-volatile integrated circuit memory device comprises a select line driver and a slope control circuit. The select line driver supplies the first select line with a select voltage limited below the power supply voltage. The slope control circuit controls a rising slope of the program voltage to prevent an occurrence of a capacitive coupling between the first select line and the word line during the program operation.

The select line drive provides the first select line with a select voltage (Vsel) that is lower than the power supply voltage by at least a coupling voltage (Vcpl) between the first select line and the word line but higher than a threshold voltage of the first select transistor. In addition, the program voltage that is provided to the word line by the slope control circuit increases in a staircase form during the program operation.

The non-volatile integrated circuit memory device may further comprise one or more additional word lines, and one or more additional non-volatile memory cell transistors. In this case, control electrodes of the additional non-volatile memory cell transistors are connected to the respective additional word lines. Current paths of the additional non-volatile memory cell transistors are connected in series between the current paths of the non-volatile memory cell transistor and the second select transistor.

According to another aspect of the present invention, a non-volatile integrated circuit memory device comprises a plurality of bit lines, a first select line, a plurality of word lines, a second select line, a plurality of memory cell strings, a select line driver, a high voltage pump circuit, a high voltage ramp circuit, and a word line decoding circuit. Each of the cell strings includes a first select transistor, a plurality of memory cell transistors corresponding to the word lines, and a second select transistor. The first select transistor, the memory cell transistors, and the second select transistor have current paths coupled in series between a corresponding one of the bit lines and a reference voltage (preferably, ground voltage VSS). In addition, control electrodes of the first select transistor, the memory cell transistors, and the second select transistor are connected to the first select line, the word lines, and the second select line, respectively.

In particular, the select line driver sequentially supplies the first select line with a first select voltage and a second select voltage lower than the first select voltage, during a program operation of the memory cell transistors.

In preferred embodiments, the first select voltage is a power supply voltage and the second select voltage is lower than the power supply voltage by at least a coupling voltage between the first select line and the word line. The high voltage pump circuit generates a program voltage that has a predetermined rise time and is higher than the power supply voltage, during the program operation. The high voltage ramp circuit decreases a rising slope of the program voltage supplied from the high voltage pump circuit during the program operation. The word line decoding circuit selects one from the word lines and supplies the selected word line with the program voltage of the decreased rising slope during the program operation. This prevents a capacitive coupling between the first select line and the selected word line.

The select line driver supplies the first select line with the second select voltage while the program voltage, of which rising slope is reduced, is applied to the selected word line. The second select voltage preferably ranges between VCC−Vcpl and Vth, where VCC is a power supply voltage, Vcpl is a coupling voltage between the first select line and the selected word line during the program operation, and Vth is a threshold voltage of the first select transistor.

According to still another aspect of the present invention, a method of programming a non-volatile integrated circuit memory device is provided. The non-volatile integrated circuit memory device includes a bit line, a first select line, a first select transistor, a word line, a non-volatile memory cell transistor, a second select line, and a second select transistor. According to the method of programming such a non-volatile integrated circuit memory device, first, a program voltage having a predetermined rising slope above a power supply voltage is generated during a program operation. Secondly, the rising slope of the program voltage becomes lessened. Finally, the first select line is supplied with a select voltage equal to or below the power supply voltage while the program voltage of the decreased rising slope is applied to the word line such that no capacitive coupling between the first select line and the word line takes place during the program operation. Memory cell transistors of the nonvolatile integrated circuit memory devices may preferably be floating gate transistors.

It would be desirable in the present invention that a ratio of a rise time of program voltage to a program time of a memory device is set to $\frac{1}{10}$ to $\frac{2}{10}$ (or 10 to 20% program rise time). For example, in case a program time of a memory device is 40 microseconds, a rise time of the program voltage generated from the slope control circuit will be about 4 thru 8 microseconds. In addition, rise time of the program voltage, controlled by the slope control circuit, increases with size of a page of memory cells.

What is claimed is:

1. A non-volatile integrated circuit memory device comprising:
    a bit line;
    a first select line;
    a first select transistor having a control electrode connected to the first select line and a current path, one end of which is connected to the bit line;
    a word line disposed adjacent to and in parallel with the first select line;
    a non-volatile memory cell transistor having a control electrode connected to the word line and a current path, one end of which is connected to the other end of the current path of the first select transistor;
    a second select line;
    a second select transistor having a control electrode connected to the second select line and a current path, one end of which is connected to a second end of the current path of the non-volatile memory cell transistor, and a second end of which is connected to a ground reference voltage;
    a high voltage pump circuit for generating a high voltage above a power supply voltage during a program operation of the non-volatile memory cell transistor;

a select line driver for supplying a select voltage limited below the power supply voltage to the first select line while the high voltage is applied to the word line;

a word line decoder for receiving the high voltage and the select voltage to apply a program voltage to the word line; and a slope control circuit for controlling a rising slope of the program voltage, the slope control circuit structured to provide an increase in the program voltage for a predetermined time long enough to inhibit a capacitive coupling between the first select line and the word line during the program operation.

2. The device as claimed in claim 1, wherein the select voltage is lower than the power supply voltage, and a difference between the select voltage and the power supply voltage is at least as much as a coupling voltage between the first select line and the word line, and wherein the select voltage is higher than a threshold voltage of the first select transistor.

3. The device as claimed as in claim 1, wherein the non-volatile integrated circuit memory device further comprises one or more additional word lines; and one or more additional non-volatile memory cell transistors, wherein control electrodes of the additional non-volatile memory cell transistors are connected to the respective additional word lines, and wherein current paths of the additional non-volatile memory cell transistors are connected in series between the current path of the non-volatile memory cell transistor and the current path of the second select transistor.

4. The device as claimed as in claim 1, wherein the program voltage is increased in a staircase manner.

5. The device as claimed as in claim 1, wherein the pre-determined time is $1/10$ to $2/10$ a program time.

6. The device as claimed as in claim 4, wherein the slope control circuit is structured to receive the high voltage and to generate a plurality of voltages.

7. The device as claimed in claim 6, wherein the voltages of the plurality of voltages are different from each other.

8. The device as claimed in claim 6, wherein at least one of the plurality of voltages is the same as the high voltage.

9. A non-volatile integrated circuit memory device comprising:

a plurality of bit lines;

a first select line;

a plurality of word lines;

a second select line;

a plurality of memory cell strings;

wherein each of the plurality of memory cell strings includes a first select transistor, a plurality of memory cell transistors corresponding to the word lines, and a second select transistor, wherein the first select transistor, the plurality of memory cell transistors, and the second select transistor have current paths connected in series between one of the bit lines and a ground reference voltage, wherein a control electrode of the first select transistor, control electrodes of the memory cell transistors, and a control electrode of the second select transistor are connected to the first select line, the word lines, and the second select line, respectively;

a select line driver for sequentially supplying a first select voltage and a second select voltage, lower than the first select voltage, to the first select line during a program operation of the memory cell transistors;

a high voltage pump circuit for generating a high voltage above a power supply voltage during the program operation, the high voltage having a predetermined rise time, a high voltage ramp circuit for increasing the rise time of the high voltage during the program operation; and a word line decoding circuit for selecting a word line adjacent to the first select line and for supplying the high voltage having the increased rise time to the selected word line during the program operation to inhibit a capacitive coupling between the first select line and the selected word line.

10. The device as claimed in claim 9, wherein the second select voltage is applied to the first select line while the high voltage having the increased rise time is applied to the selected word line.

11. The device as claimed in claim 9, wherein the high voltage of the increased rise time is increased in a staircase manner during the program operation.

12. The device as claimed in claim 9, wherein the second select voltage ranges between VCC–Vcpl and Vth; and wherein VCC is a power supply voltage, Vcpl is a coupling voltage between the first select line and the selected word line during the program operation, and Vth is a threshold voltage of the first select transistor.

13. The device as claimed in claim 9, wherein the select line driver comprises a first voltage supply circuit for supplying the first select voltage to the first select line in response to a first program enable signal; and a second voltage supply circuit for supplying the second select voltage to the first select line in response to a second program enable signal, wherein the first and second program enable signals are alternately activated and the second program enable signal is activated while the high voltage having the increased rise time is applied to the selected word line.

14. The device as claimed in claim 13, wherein the first program enable signal is inactivated when the second program enable signal is activated.

15. The device as claimed in claim 9, wherein the rise time is about $1/10$ to $2/10$ a program time.

16. A non-volatile integrated circuit memory device comprising;

a bit line;

a first select line;

a first select transistor having a control electrode connected to the first select line and a current path, one end of which is connected to the bit line;

a word line adjacent to and disposed parallel with the first select line;

a non-volatile memory cell transistor having a control electrode connected to the word line and a current path, one end of which is connected to a second end of the current path of the first select transistor;

a second select line;

a second select transistor having a control electrode connected to the second select line and a current path, one end of which is connected to the other end of the current path of the non-volatile memory cell transistor, and a second end of which is connected to a ground voltage;

a high voltage pump circuit for generating a high voltage above a power supply voltage;

a high voltage ramp circuit connected to the high voltage pump circuit for supplying a program voltage to the word line in response to a plurality of ramp enable signals during a program operation, wherein the ramp enable signals are sequentially activated and activating periods of the ramp enable signals are partially overlapped each other such that the program voltage on the word line is increased in a staircase manner; and a select line driver for supplying a select voltage, lower than a power supply voltage, to the first select line in response to a plurality of program enable signals while the program voltage is supplied into the word line.

17. The device as claimed in claim 16, wherein the high voltage ramp circuit supplies a plurality of voltages to the word line in response to the ramp enable signals, and wherein the plurality of voltages are different from each other and one of the plurality of voltages is the same as either the high voltage or the program voltage.

18. The device as claimed in claim 16, wherein the high voltage ramp circuit includes a plurality of load elements connected in series between the high voltage and a word line decoder.

19. The device as claimed in claim 16, wherein the voltage supply circuit includes a plurality of load circuits connected in parallel between the high voltage and a word line decoder.

20. The device as claimed in claim 19, wherein load values of a plurality of the load circuits are different from each other.

21. A non-volatile integrated circuit memory device comprising:
a bit line;
a first select line;
a first select transistor having a control electrode connected to the first select line and a current path, one end of which is connected to the bit line;
a word line adjacent to and disposed parallel with the first select line;
a word line decoder connected to the word line for selecting the word line;
a non-volatile memory cell transistor having a control electrode connected to the word line and a current path, one end of which is connected to a second end of the current path of the first select transistor;
a second select line;
a second select transistor having a control electrode and a current path, one end of which is connected to a second end of the current path of the non-volatile memory cell transistor, and a second end of which is connected to a ground voltage;
a high voltage pump circuit for generating a high voltage above a power supply voltage during a program operation;
a high voltage ramp circuit having a plurality of load elements connected in series between the high voltage and the word line decoder for sequentially supplying a plurality of supply voltages through the load elements to the word line in response to a plurality of ramp enable signals; and
a select line driver for supplying a predetermined select voltage into the first select line while the plurality of supply voltages are supplied into the word line.

22. The device as claimed in claim 21, wherein the predetermined select voltage ranges between VCC−Vcpl and Vth; and wherein VCC is the power supply voltage, Vcpl is the coupling voltage between the first select line and the selected word line during the program operation, and Vth is a threshold voltage of the first select transistor.

23. The device as claimed in claim 21, wherein the plurality of ramp enable signals are overlapped during the program operation such that a potential of the word line is increased in a staircase manner during a predetermined time.

24. The device as claimed in claim 23, wherein the predetermined time is about 1/10 to 2/10 of a program time.

25. The device as claimed in claim 21, wherein the high voltage ramp circuit comprises:
first, second, and third load elements connected in series between the high voltage and the word line decoder in this order;
a first voltage pump for supplying a first supply voltage in response to a first ramp enable signal during the program operation;
a first switch transistor having a control electrode connected to the first supply voltage and a current path connected between the third load element and the word line decoder;
a second voltage pump for supplying a second supply voltage in response to a second ramp enable signal during the program operation;
a second switch transistor having a control electrode connected to the second supply voltage and a current path connected between the second load element and the word line decoder;
a third voltage pump for supplying a third supply voltage in response to a third ramp enable signal during the program operation;
a third switch transistor having a control electrode connected to the third supply voltage and a current path connected between the first load element and the word line decoder;
a fourth voltage pump for supplying a fourth supply voltage in response to a fourth ramp enable signal during the program operation; and
a fourth switch transistor having a control electrode connected to the fourth supply voltage and a current path connected between the program voltage and the word line decoder, wherein the first, second, third, and fourth ramp enable signals are sequentially activated.

26. A non-volatile integrated circuit memory device comprising:
a bit line;
a first select line;
a first select transistor having a control electrode connected to the first select line and a current path, one-end side of which is connected to the bit line;
a word line adjacent to and disposed parallel with the first select line;
a word line decoder connected to the word line for selecting the word line;
a non-volatile memory cell transistor having a control electrode connected to the word line and a current path, one end of which is connected to the other end of the current path of the first select transistor;
a second select line;
a second select transistor having a control electrode connected to the second select line and a current path, one end of which is connected to the other end of the current path of the non-volatile memory cell transistor, and the other end of which is connected to a ground reference voltage;
a high voltage pump circuit for generating a high voltage above a power supply voltage;

a high voltage ramp circuit having a plurality of load circuits connected in parallel between the high voltage and the word line decoder for supplying a plurality of supply voltages in response to a plurality of ramp enable signals; and a select line driver for supplying a predetermined select voltage to the first select line while the plurality of supply voltages are supplied to the word line.

27. The device as claimed in claim 26, wherein the predetermined select voltage ranges between VCC–Vcpl and Vth; and wherein VCC is the power supply voltage, Vcpl is a coupling voltage between the first select line and the selected word line during the program operation, and Vth is a threshold voltage of the first select transistor.

28. The device as claimed in claim 26, wherein the plurality of ramp enable signals are overlapped such that the program voltage on the word line is increased in a staircase manner for a predetermined time at the program operation.

29. The device as claimed in claim 26, wherein load values of the plurality of load circuits are different from each other.

30. The device as claimed in claim 26, wherein the high voltage ramp circuit comprises:

first, second and third load circuits connected in parallel between the high voltage and the word line decoder in this order;

a first voltage pump for supplying a first supply voltage in response to a first ramp enable signal during the program operation;

a first switch transistor having a control electrode connected to the first supply voltage and a current path connected between the program voltage and the first load circuit;

a second voltage pump for supplying a second supply voltage in response to a second ramp enable signal during the program operation;

a second switch transistor having a control electrode connected to the second supply voltage and a current path connected between the program voltage and the second load circuit;

a third voltage pump for supplying a third supply voltage in response to a third ramp enable signal during the program operation;

a third switch transistor having a control electrode connected to the third supply voltage and a current path connected between the program voltage and the first load circuit;

a fourth voltage pump for supplying a fourth supply voltage in response to a fourth ramp enable signal during the program operation; and a fourth switch transistor having a control electrode connected to the fourth supply voltage and a current path connected between the program voltage and the word line, wherein the first, second, third, and fourth ramp enable signals are sequentially activated such that a potential of the word line is increased in a staircase manner during the program operation.

31. A method of programming a non-volatile integrated circuit memory device comprising a bit line; a first select line; a first select transistor having a control electrode connected to the first select line and a current path, one end side of which is connected to the bit line; a word line adjacent to and disposed parallel with the first select line; a non-volatile memory cell transistor having a control electrode connected to the word line and a current path, one end of which is coupled to a second end of the current path of the first select transistor; a second select line; and a second select transistor, one end of which is coupled to a second end of the current path of the non-volatile memory cell transistor, and the other end of which is connected to a ground voltage, the method comprising:

generating a program voltage having a predetermined rising slope during a program operation, the program voltage higher than a power supply voltage;

reducing the rising slope of the program voltage; and supplying a select voltage to the first select line while the program voltage having the reduced rising slope is applied to the word line, the select voltage being equal to or below the power supply voltage.

32. The method as claimed in claim 31, wherein a rise time of the program voltage of the reduced rising slope is $\frac{1}{10}$ to $\frac{2}{10}$ a program time.

* * * * *

UNITED STATES PATENT AND TRADEMARK OFFICE
CERTIFICATE OF CORRECTION

PATENT NO. : 6,804,150 B2
DATED : October 12, 2004
INVENTOR(S) : Park et al.

It is certified that error appears in the above-identified patent and that said Letters Patent is hereby corrected as shown below:

Column 5,
Line 22, "lines S1 to S116, and" should read -- lines S1 to S16, and --.

Column 6,
Line 48, "line WLi, increases" should read -- WL1, increases --.
Line 59, "line (e.g., WLi) adjacent" should read -- line (e.g., WL1) adjacent --.

Column 8,
Line 14, "VSS; allowing" should read -- VSS, allowing --.

Column 14,
Line 55, "the, invention" should read -- the invention --

Signed and Sealed this

Fourteenth Day of June, 2005

JON W. DUDAS
*Director of the United States Patent and Trademark Office*